(12) United States Patent
Knee et al.

(10) Patent No.: US 11,757,467 B2
(45) Date of Patent: Sep. 12, 2023

(54) CIRCUITS FOR CONVERTING SFQ-BASED RZ AND NRZ SIGNALING TO BILEVEL VOLTAGE NRZ SIGNALING

(71) Applicants: Derek L. Knee, Fort Collins, CO (US); Mark B. Ketchen, Hadley, MA (US); Randall M. Burnett, Catonsville, MD (US)

(72) Inventors: Derek L. Knee, Fort Collins, CO (US); Mark B. Ketchen, Hadley, MA (US); Randall M. Burnett, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 263 days.

(21) Appl. No.: 17/401,526

(22) Filed: Aug. 13, 2021

(65) Prior Publication Data

US 2023/0046568 A1 Feb. 16, 2023

(51) Int. Cl.
*H03M 7/12* (2006.01)
*H03M 5/14* (2006.01)
(Continued)

(52) U.S. Cl.
CPC ...... *H03M 5/145* (2013.01); *H03K 19/00315* (2013.01); *H03K 19/003* (2013.01);
(Continued)

(58) Field of Classification Search
CPC .......... H03M 5/145; H03M 5/02; H03M 5/14; H03K 19/00315; H03K 19/195; H03K 19/003
See application file for complete search history.

(56) References Cited

U.S. PATENT DOCUMENTS

| 4,623,804 A | 11/1986 | Goto |
| 5,436,451 A | 7/1995 | Silver et al. |

(Continued)

FOREIGN PATENT DOCUMENTS

| EP | 0660126 A2 | 6/1995 |
| EP | 1213774 B1 | 12/2010 |

(Continued)

OTHER PUBLICATIONS

André, et al. : "A Coherent All-Electrical Interface Between Polar Molecules and Mesoscopic Superconducting Resonators"; Nature Physics, vol. 2, No. 9, Aug. 27, 2006, pp. 636-642; XP055174009, ISSN: 1745-2473; DOI: 10.1038/nphys386.

(Continued)

*Primary Examiner* — Joseph J Lauture
(74) *Attorney, Agent, or Firm* — Tarolli, Sundheim, Covell & Tummino LLP

(57) ABSTRACT

Edge-sensitive, state-based single flux quantum (SFQ) based circuitry and related methods convert return-to-zero (RZ) or non-return-to-zero (NRZ) encoded SFQ-pulse-based signals to bilevel NRZ phase signals that can subsequently be converted to bilevel voltage signals by an output amplifier (OA). The SFQ-based circuitry can be integrated with a current amplification stage of a driver that can be coupled to a stage of the OA. The SFQ-based circuitry can be made to be compatible with RQL-encoded input signals that can be either RZ or NRZ. The SFQ-based circuitry can thus be compatible with both wave-pipelined (WPL) and phase-mode (PML) RQL circuitry. Because the SFQ-based circuitry and related methods are edge-sensitive and state-based, they can function at system clock rates in excess of 1 GHz with reduced glitches and improved bit error rates as compared to other superconducting RZ-NRZ conversion circuitry and methods.

20 Claims, 15 Drawing Sheets

(51) Int. Cl.
*H03K 19/003* (2006.01)
*H03M 5/02* (2006.01)
*H03K 19/195* (2006.01)

(52) U.S. Cl.
CPC ............ *H03K 19/195* (2013.01); *H03M 5/02* (2013.01); *H03M 5/14* (2013.01)

(56) References Cited

U.S. PATENT DOCUMENTS

| | | |
|---|---|---|
| 5,936,458 A | 8/1999 | Rylov |
| 5,963,351 A | 10/1999 | Kaplounenko et al. |
| 6,157,329 A | 12/2000 | Lee et al. |
| 6,242,939 B1 | 6/2001 | Nagasawa et al. |
| 6,331,805 B1 | 12/2001 | Gupta et al. |
| 6,653,962 B2 | 11/2003 | Gupta et al. |
| 6,815,708 B1 | 11/2004 | Iguchi et al. |
| 6,864,005 B2 | 3/2005 | Mossman |
| 7,095,227 B2 | 8/2006 | Tarutani et al. |
| 7,227,480 B2 | 6/2007 | Furuta et al. |
| 7,598,897 B2 | 10/2009 | Kirichenko |
| 7,630,588 B2 | 12/2009 | Ouchi |
| 7,689,070 B2 | 3/2010 | Ouchi |
| 7,724,020 B2 | 5/2010 | Herr |
| 7,724,083 B2 | 5/2010 | Herr et al. |
| 7,772,871 B2 | 8/2010 | Herr et al. |
| 7,782,077 B2 | 8/2010 | Herr et al. |
| 7,786,748 B1 | 8/2010 | Herr |
| 7,889,992 B1 | 2/2011 | Divincenzo et al. |
| 8,188,901 B1 | 5/2012 | Inamdar et al. |
| 8,670,807 B2 | 3/2014 | Rose et al. |
| 8,849,075 B2 | 9/2014 | Painter et al. |
| 8,952,671 B2 | 2/2015 | Shimizu et al. |
| 9,097,751 B1 | 8/2015 | Longhini et al. |
| 9,174,840 B2 | 11/2015 | Herr et al. |
| 9,312,878 B1 | 4/2016 | Inamdar et al. |
| 9,443,576 B1 | 9/2016 | Miller |
| 9,455,707 B2 | 9/2016 | Herr et al. |
| 9,467,126 B1 | 10/2016 | Naaman et al. |
| 9,497,126 B2 | 11/2016 | Matsuhira |
| 9,595,970 B1 | 3/2017 | Reohr et al. |
| 9,613,699 B1 | 4/2017 | Reohr et al. |
| 9,646,682 B1 | 5/2017 | Miller et al. |
| 9,779,803 B1 | 10/2017 | Konigsburg et al. |
| 9,780,765 B2 | 10/2017 | Naaman et al. |
| 9,787,312 B2 | 10/2017 | Herr et al. |
| 9,853,645 B1 | 12/2017 | Mukhanov et al. |
| 9,876,505 B1 | 1/2018 | Dai et al. |
| 9,887,700 B2 | 2/2018 | Carmean et al. |
| 10,090,841 B1 | 10/2018 | Herr |
| 10,243,582 B1 * | 3/2019 | Herr .................. H03M 5/02 |
| 10,491,178 B2 | 11/2019 | Naaman et al. |
| 2001/0025012 A1 | 9/2001 | Tarutani et al. |
| 2004/0201099 A1 | 10/2004 | Herr |
| 2004/0201400 A1 | 10/2004 | Herr |
| 2005/0047245 A1 | 3/2005 | Furuta et al. |
| 2005/0078022 A1 | 4/2005 | Hirano et al. |
| 2005/0231196 A1 | 10/2005 | Tarutani et al. |
| 2006/0049891 A1 | 3/2006 | Crete |
| 2006/0085160 A1 | 4/2006 | Ouchi |
| 2006/0209413 A1 | 9/2006 | Kim et al. |
| 2006/0255987 A1 | 11/2006 | Nagasawa et al. |
| 2008/0049885 A1 | 2/2008 | Inamdar |
| 2008/0267557 A1 | 10/2008 | Wang et al. |
| 2008/0304038 A1 | 12/2008 | Ouchi |
| 2009/0002014 A1 | 1/2009 | Gupta et al. |
| 2009/0075825 A1 | 3/2009 | Rose et al. |
| 2010/0026537 A1 | 2/2010 | Kirichenko |
| 2010/0033252 A1 | 2/2010 | Herr et al. |
| 2012/0274494 A1 | 11/2012 | Kirichenko |
| 2013/0121633 A1 | 5/2013 | Painter et al. |
| 2015/0060650 A1 | 3/2015 | Park |
| 2015/0060756 A1 | 3/2015 | Park |
| 2015/0092465 A1 | 4/2015 | Herr et al. |
| 2015/0094207 A1 | 4/2015 | Herr et al. |
| 2015/0349780 A1 | 12/2015 | Naaman et al. |
| 2016/0013791 A1 | 1/2016 | Herr et al. |
| 2016/0079968 A1 | 3/2016 | Strand et al. |
| 2016/0164505 A1 | 6/2016 | Naaman et al. |
| 2017/0017742 A1 | 1/2017 | Oberg et al. |
| 2018/0145664 A1 | 5/2018 | Herr et al. |

FOREIGN PATENT DOCUMENTS

| | | |
|---|---|---|
| JP | 2013058998 A | 3/2013 |
| WO | 98/08307 A1 | 2/1998 |
| WO | 2009/023969 A1 | 2/2009 |
| WO | 2011/032825 A1 | 3/2011 |
| WO | 2014/028302 A2 | 2/2014 |
| WO | 2017/204977 A1 | 11/2017 |
| WO | 2018/044563 A1 | 3/2018 |

OTHER PUBLICATIONS

Aoki, et al.: "Observation of Strong Coupling Between One Atom and a Monolithic Microresonator", Norman Bridge Laboratory of Physics 12-33, California Institute of Technology, Pasadena, CA 91125, USA, Sep. 4, 2006, pp. 1-12.

Aspelmeyer, et al., "Cavity Optomechanics", Rev. Mod. Phys., vol. 86, No. 4, pp. 1391-1452 (2013), DOI: 10 113/RevModPhys.86.1391.

Bochman, et al., "Nanomechanical Coupling between Microwave and Optical Photons", Nature Physics, vol. 9, No. 11, pp. 712-716 (2013), DOI: 10.1038/nphys2748.

Cicak et al: "Vacuum-Gap Capacitors for Low-Loss Superconducting Resonant Circuits", IEEE Transactions on Applied Superconductivity, IEEE Service Center, Los Alamitos, CA, US, vol. 19, No. 3, Jun. 1, 2009 (Jun. 1, 2009), pp. 948-952, XP011262430, ISSN: 1051-8223.

CST AG Nanophotonics and integrated optics, "Photonic Crystal Cavities" (2013).

Dicarlo, et al.: "Demonstration of Two-Qubit Algorithms with a Superconducting Quantum Processor", Departments of Physics and Applied Physics, Yale University, New Haven, CT 06511, USA, May 1, 2009, pp. 1-6 & Supplemental Material pp. 1-3.

Eichenfield, et al.: "Optomechanical Crystals", California Institute of Technology, Pasadena, CA 91125, USA, Jun. 6, 2009, pp. 1-16.

Favero, et al., "Optomechanics of Deformable Optical Cavities", Nature Photonics, vol. 3, No. 4, pp. 201-205 (2009), DOI: 10.1038/nphoton.2009.42.

Google search results on "optical cavity nanophotonic crystal" Sep. 29, 15.

Herr, et al.: "Ultra-Low-Power Superconductor Logic"; Journal of Applied Physics 109, 103903 (2011); Published Online: May 2011; https://doi.org/10.1063/1.3585849.

Herr: "A High-Efficiency Superconductor Distributed Amplifier"; Published Jan. 21, 2010 • IOP Publishing Ltd; Superconductor Science and Technology, vol. 23, No. 2.

Hossein-Zadeh,et al.: "An Optomechanical Oscillator on a Silicon Chip", IEEE Journal of Selected Topics in Quantum Electronics, vol. 16, No. 1, Jan./Feb. 2010, pp. 276-287.

Kimble: "The Quantum Internet", Norman Bridge Laboratory of Physics 12-33, Jun. 25, 2006, pp. 1-15.

Lin, et al.: "Coherent Mixing of Mechanical Excitations in Nano-Optomechanical Structures", Laboratory of Applied Physics, California Institute of Technology, Pasadena, CA 91125, USA, Aug. 7, 2009, pp. 1-27.

Mukhanov O A et al: "Development of Energy-efficient Cryogenic Optical (ECO) data link", 2013 IEEE 14th International Superconductive Electronics Conference (ISEC). IEEE, Jul. 7, 2013 (Jul. 7, 2013), pp. 1-3, XP032485120, DOI: 10.1109/ISEC.2013.6604276.

O'Connell, et al.: "Quantum Ground State and Single-Phonon Control of a Mechanical Resonator", Nature, Articles, vol. 464, Apr. 1, 2010, pp. 697-703.

Painter: Optomechanical crystals Photonics Conference (IPC), 2012 IEEE, IEEE, Sep. 23, 2012 (Sep. 23, 2012), p. 546, XP032269201, DOI: 10.1109/IPCON.2012.6358735 ISBN: 978-1-4577-0731-5.

(56) References Cited

OTHER PUBLICATIONS

Regal, et al.: "From Cavity Electromechanics to Cavity Optomechanics", 22nd International Conference on Atomic Physics, Journal of Physics: Conference Series 264 (2011) 012025, pp. 1-8.
Safavi-Naeini, et al.: "Proposal for an Optomechanical Traveling Wave Phonon-Photon Translator", New Journal of Physics 13 (2011) 013017 (30pp), Published Jan. 13, 2011, Online at http://www.njp.org, pp. 1-30.
Sillanpää, et al.: "Coherent Quantum State Storage and Transfer Between Two Phase Qubits Via a Resonant Cavity", National Institute of Standards and Technology, 325 Broadway, Boulder, CO 80305, USA, Sep. 14, 2007, pp. 1-17.
Stannigel, et al., "Opto-Mechanical Transducers for Long-Distance Quantum Communication", Jun. 22, 2010, DOI: 10.1103/PhysRevLett. 105.220501.
Sun et al: "A superhigh-frequency optoelectromechanical system based on a slotted photonic crystal cavity", Applied Physics Letters, American Institute of Physics, US, vol. 101, No. 99. Nov. 26, 2012 (Nov. 26, 2012), pp. 221116-221116, XP012168118, ISSN: 0003-6951, DOI: 10.1063/1.4769045.
Tallur, et al., "Rayleigh Scattering Boosted Multi-GHz Displacement Sensitivity in Whispering Gallery Opto-Mechanical Resonators", Opt. Express 21, 27780-27788 (2013).
Tao, et al., "A Novel Transducer for Photon Energy Detection Via Near-Field Cavity Optomechanics", in Solid-State Sensors, Actuators and Microsystems (Transducers & Eurosensors XXVII), 2013 Transducers & Eurosensors XXVII: The 17th International Conference on , vol. No., pp. 1511-1514, 16-20 (2013) DOI: 10.1109/Transducers.2013.6627068.
Teufel, et al. , "Prospects for Cooling Nanomechanical Motion by Coupling to a Superconducting Microwave Resonator", New Journal of Physicans, vol. 10, No. 9, pp. 095002 (2008), DOI: 10.1088/1367-2630/10/9/095002.
Teufel, et al.: "Circuit Cavity Electromechanics in the Strong-Coupling Regime", Letter, Nature, vol. 471, Mar. 10, 2011, pp. 204-208.
Winger et al.: "A chip-scale integrated cavity-electro-optomechanics platform", Optics Express, vol. 19, No. 25, Nov. 22, 2011 (Nov. 22, 2011), pp. 24905-24921, XP002732657.

\* cited by examiner

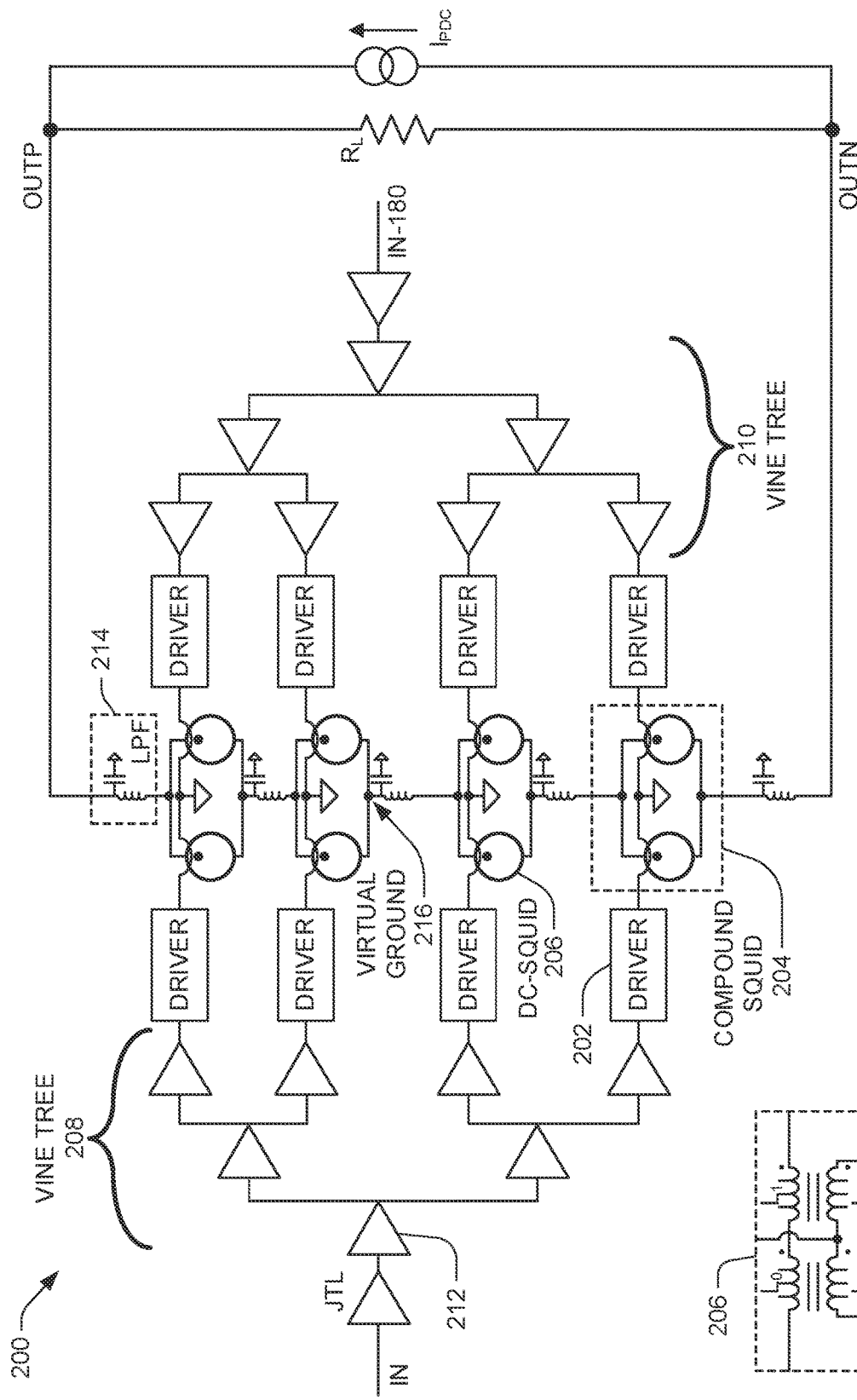

CIRCUITS FOR CONVERTING SFQ-BASED RZ AND NRZ SIGNALING TO BILEVEL VOLTAGE NRZ SIGNALING

TECHNICAL FIELD

This disclosure relates generally to superconducting circuits, and specifically to circuits for converting single flux quantum (SFQ) based return-to-zero (RZ) signaling and non-return-to-zero signaling to bilevel voltage NRZ signaling.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. In some implementations, as an alternative to CMOS technology, single flux quantum (SFQ) circuitry utilizes superconducting Josephson junctions (JJs), with typical signal power of around 4 nanowatts (nW), at a typical data rate of 20 gigabits per second (Gb/s) or greater, and operating temperatures of around 4 kelvins.

In conventional (non-superconducting) digital electronics, return-to-zero (RZ) encoding describes the encoding of digital logic values as one of two values in a voltage signal such that the voltage level in the signal always returns to a low value after presenting a high value (representing a logical "1," e.g.), even when the signal is representative of successive high values. In non-return-to-zero (NRZ) encoding, by contrast, successive logical high values are represented as a voltage signal that, aside from any negligible glitches that are more or less instantaneous, remains high until a logical low value is presented in the signal to bring the signal voltage level back to its low value. Thus, in conventional digital electronics, RZ and NRZ signals ideally take the form of bilevel voltage signals. This conventional-electronics, bilevel NRZ signaling is referred to herein as "CMOS NRZ", CMOS standing for complementary metal-oxide-semiconductor, a fabrication technology often used in conventional digital electronics.

Some superconducting digital electronic systems do not use bilevel voltages to encode data signals, but instead encode data as sequences of single flux quantum (SFQ) pulses propagated within Josephson circuitry, such as Josephson transmission lines (JTLs). For example, superconducting systems in wave-pipelined logic (WPL) implementations of the reciprocal quantum logic (RQL) family encode a logical high digital value as a single flux quantum (SFQ) pulse of one polarity followed, within about a half an AC clock cycle, by a resetting SFQ pulse of the opposite polarity (e.g., a positive SFQ pulse followed by a negative SFQ pulse). A logical low digital value is encoded as the absence of an SFQ pulse in WPL RQL. Because the complementary pulse resets the effect of the initial SFQ pulse, data encoding in WPL RQL can generally be considered to use RZ signaling.

By contrast, phase-mode logic (PML) implementations of RQL encode data as Josephson junction (JJ) phase, phase being the integral of voltage. For example, in a PML circuit, a positive SFQ pulse can (provided adequate positive biasing conditions) trigger a JJ and set its phase from 0 radians to $2\pi$ radians, representing, for example, a logical "high" signal or logical "1". A subsequent negative pulse in the PML circuit, which need not necessarily come within the same AC clock cycle, can (provided adequate negative biasing conditions) untrigger the JJ (trigger it in the direction opposite that of its initial triggering) and thereby reset the JJ's phase to 0 radians, representing a logical "low" signal or logical "0". Accordingly, data encoding in PML RQL can generally be considered to use NRZ signaling. To avoid confusion with the bilevel voltage NRZ signaling used in conventional electronics, this phase-based NRZ signaling used in PML RQL is referred to herein as "RQL NRZ" and the bilevel voltage NRZ signaling used in conventional electronics is referred to herein as "CMOS NRZ".

SUMMARY

One example includes superconducting circuitry for converting an SFQ-based RZ RQL signal or NRZ RQL signal to an NRZ bilevel phase signal. The circuitry includes a SET signal input to a SET signal path configured to accept a first SFQ signal and a RESET signal input to a RESET signal path configured to accept a second SFQ signal based on the first SFQ signal. The circuitry further includes an output node at which the SET signal path and the RESET signal path are joined into an output path. The circuitry further includes an escape Josephson junction in the SET signal path between the SET signal input and the output node. The circuitry further includes an output Josephson junction coupled to the output node at a first end and to ground at a second end. The circuitry further includes a primary output inductor in the output path, coupled to the output node at a first end and to ground at a second end.

Another example includes a method of converting an SFQ-based RZ RQL signal to a bilevel NRZ quantum phase signal. An SFQ signal is provided as a SET signal and a delayed version of the SFQ signal is provided as a RESET signal to respective SET and RESET signal paths in an RZ-NRZ circuit. A positive SFQ pulse in the SET signal is transmitted along the SET signal path to trigger an output JJ in the RZ-NRZ circuit and raise the phase at an output node of the RZ-NRZ circuit to about $2\pi$ radians. A negative SFQ pulse in the SET signal is transmitted along the SET signal path to trigger an escape JJ in the SET signal path. A positive SFQ pulse in the RESET signal is transmitted along the RESET signal path, not lowering the phase at the output node to about 0 radians. A negative SFQ pulse in the RESET signal can then be transmitted along the RESET signal path to de-trigger the escape JJ, de-trigger the output JJ, and lower the phase at the output node to about 0 radians. Alternatively, a second positive SFQ pulse in the SET signal can be transmitted along the SET signal path to de-trigger the escape JJ and not lower the phase at the output node to about 0 radians, a first negative SFQ pulse in the RESET signal can be transmitted along the RESET signal path, not lowering the phase at the output node to about 0 radians, a second negative SFQ pulse in the SET signal can be transmitted along the SET signal path to re-trigger the escape JJ, a second positive SFQ pulse in the RESET signal can be transmitted along the RESET signal path, not lowering the phase at the output node to about 0 radians, and a subsequent negative SFQ pulse in the RESET signal can be transmitted along the RESET signal path to de-trigger the escape JJ, de-trigger the output JJ, and lower the phase at the output node to about 0 radians.

Yet another example includes DC-biased superconducting circuitry for converting an SFQ-based RZ signal to an NRZ bilevel phase signals. A SET signal path is coupled between a SET signal input and a first node in a DC-SQUID loop. The SET signal path includes a first SET-path Josephson junction coupled in series between the SET signal input and a first intermediate node, the first intermediate node being in the SET signal path between the SET signal input and the first node in the DC-SQUID loop. The SET signal path further includes a second SET-path Josephson junction coupled between the first intermediate node and ground. A RESET signal path is coupled between a RESET signal input and a second node in the DC-SQUID loop. The RESET signal path includes a first RESET-path Josephson junction coupled in series between the RESET signal input and a second intermediate node, the second intermediate node being in the RESET signal path between the RESET signal input and the second node in the DC-SQUID loop. The RESET signal path further includes a second RESET-path Josephson junction coupled between the second intermediate node and ground. An output inductor is coupled in the DC-SQUID loop coupled between the first node and the second node. A DC voltage source is coupled via a resistor to the first node in the DC-SQUID loop. The DC-SQUID loop comprises a first DC-SQUID Josephson junction coupled between the first node in the DC-SQUID loop and ground, and a second DC-SQUID Josephson junction coupled between the second node in the DC-SQUID and ground.

BRIEF DESCRIPTION OF THE DRAWINGS

FIG. 2 is a block diagram of an example RQL RZ to CMOS NRZ converter.

FIG. 3 is a schematic diagram of an example DC-SQUID.

DETAILED DESCRIPTION

This disclosure relates generally to logical circuits for use in superconducting computing systems, including reciprocal quantum logic (RQL) systems, and related methods. This disclosure more specifically relates to circuit circuits and methods useful in converters for interfacing between circuitry that uses signaling based on single flux quantum (SFQ) pulses, including the return-to-zero (RZ) data encoding used by wave-pipelined logic (WPL) and the non-return-to-zero (NRZ) data encoding used by phase-mode logic (PML), and circuitry that uses bilevel voltage NRZ encoding, or what will be referred to herein as CMOS NRZ, as commonly used by CMOS-based serializers and deserializers. Because transmission rates that are limited either by semiconductor electronics or by interconnect bandwidths can be increased by a factor of two using CMOS NRZ encoding versus using RZ encoding, circuits and methods herein are useful in providing CMOS NRZ output from superconducting digital systems that rely on SFQ pulses for logic encoding and signal transmission, such as those based on WPL or PML RQL, when interfacing CMOS-NRZ-based systems. RQL circuits of the type described herein have been fabricated and measured to operate in the range of between 2 and 12 gigabits per second.

Figure 1:
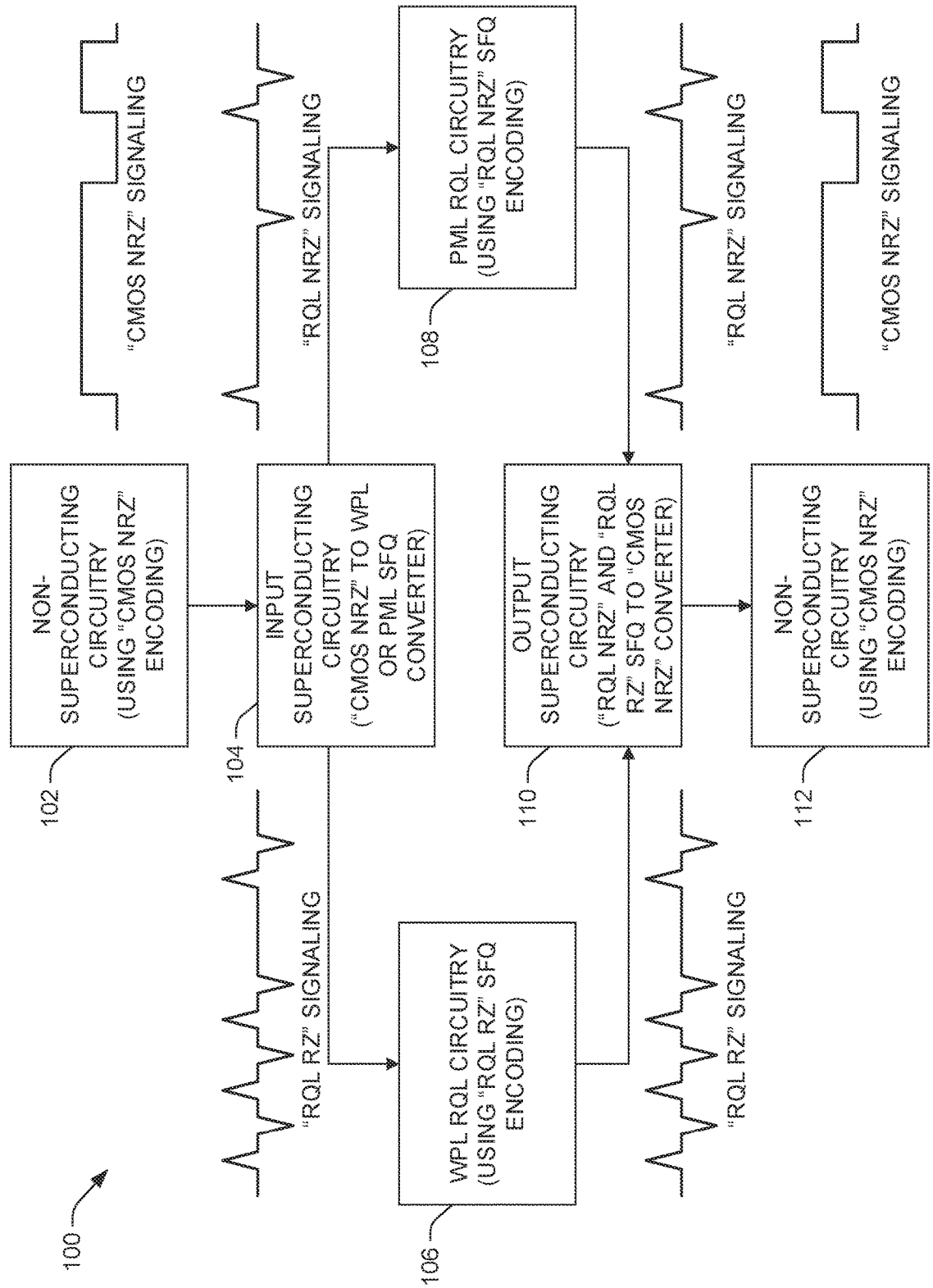
FIG. 1 is a system block diagram of an example superconducting computing system that is provided data encoded using CMOS NRZ signaling, converts the data to RQL RZ or RQL NRZ signaling for use in superconducting computing operations, and then converts result data back to CMOS NRZ for output.

FIG. 1 is a system block diagram of an example superconducting computing system 100 that is provided data encoded using CMOS NRZ signaling, converts the data to RQL RZ or RQL NRZ signaling for use in superconducting computing operations, and then converts result data back to CMOS NRZ for output. In system 100, non-superconducting circuitry 102, 112, which may operate at about room temperature or higher, uses CMOS NRZ encoding for its signals (e.g., data signals). By contrast, RQL circuitry 106, 108, which can perform computational processing at superconducting speeds (e.g., microwave-frequency clock speeds) and may be kept at cryogenic temperatures, uses SFQ encoding for its signals (e.g., data signals). System 100 can include WPL RQL circuitry 106, or PML RQL circuitry 108, or both. WPL RQL circuitry 106 uses RQL RZ encoding in which the presence of reciprocal SFQ pulses represents one digital logic state (e.g., logical "1") and the absence of reciprocal SFQ pulses represents the complementary digital logic state (e.g., logical "0"). PML RQL circuitry 108 uses RQL NRZ encoding in which a first Josephson junction (JJ) phase (e.g., 0 radians) represents one digital logic state (e.g., logical "0") and a second JJ phase (e.g., $2\pi$ radians) represents the complementary digital logic state (e.g., logical "1").

Input superconducting circuitry 104 in FIG. 1 converts CMOS NRZ encoded signals (e.g., data), either to RQL RZ encoding that either uses reciprocal pairs of SFQ pulses, which is an encoding standard used by WPL RQL superconductor logic, as in WPL RQL circuitry 106, or to RQL NRZ encoding, which is an encoding standard used by PML RQL superconductor logic, as in PML RQL circuitry 108. Output superconducting circuitry 110 is configured to convert RQL RZ or RQL NRZ encoded signals back to CMOS NRZ encoding for use with non-superconducting circuitry 112, which may be the same or different circuitry as circuitry 102, and/or may be part of the same room-temperature system as circuitry 102. The superconducting circuitry shown in FIG. 1 and otherwise described herein can be implemented, for example, on a chip, alone or along with other superconducting circuitry, and operated, for example, at cryogenic temperatures.

FIG. 2 is a block diagram of an example RQL RZ to CMOS NRZ converter 200. Converter 200 is structured as an 4-row stack output amplifier (OA) implemented in RQL. Each row of the stack comprises two drivers 202 on the left and right sides, each driver feeding into a respective left or right side of a compound superconducting quantum interference device (SQUID) 204. Each compound SQUID 204 can, for example, be made up of two individual DC-SQUIDs 206. An example of a DC-SQUID 206 is illustrated in FIG. 3. Each DC-SQUID can, for example, include two Josephson junctions (JJs), labeled $J_2$ and $J_3$ in the illustrated example, connected in a loop with two secondary inductors, labeled $L_2$ and $L_3$ in the illustrated example, through which flux can be transformer-coupled from driver 202 via primary inductors $L_0$, $L_1$. A Josephson transmission line (JTL) vine tree 208, comprising individual JTLs 212 arranged in a multiply bifurcating fashion, splits an SFQ-based input signal IN for provision to the drivers 202 on the left side of converter 200. The input signal is also shifted by about 180°, e.g., using JTL phase delay circuitry (not shown), for provision as SFQ-based signal IN-180 to a second JTL vine tree 210 that spits this time-shifted version of the input signal for provision to drivers 202 on the right side of converter 200. Each driver 202 includes at least a current amplification stage to boost current provided from the respective JTL vine tree 208 or 210.

Converter 200 is configured to convert a positive single flux quantum (SFQ) input pulse into a DC voltage. The incoming positive SFQ input pulse provided at left-side input node IN, and thus to each DC-SQUID 206 on the left side of converter 200, results in high-frequency oscillations of the DC-SQUIDs 206 on the left side of converter 200. A delayed version of the incoming positive SFQ pulse is provided at right-side input node IN-180, and thus to each DC-SQUID 206 on the right side of converter 200. The delayed version of the incoming positive SFQ pulse can be shifted, for example, by about 180° with respect to an AC clock signal. External DC current source $I_{PDC}$ biases the DC-SQUIDs 206 at a particular DC operating point such that the oscillations occur only when additional magnetic flux is coupled into the DC-SQUID loop 206 via the transformers comprising the inductors labeled $L_0$ through $L_3$. Each oscillation of the DC-SQUID loop 206 releases an SFQ voltage pulse. The SFQ voltage pulses released by the DC-SQUID oscillations are averaged via inter-row low-pass filters (LPFs) 214, resulting in an output DC voltage. A subsequent reciprocal (negative-going) SFQ input pulse provided to left-side input IN (and its corresponding time-shifted version provided to right-side input INT-180) disables this output voltage by canceling the coupled flux such that the DC-SQUID oscillation stops. Due to the symmetry of the design of the converter 200, a virtual ground node 216 exists in the center of this DC-SQUID stack. Each row in the vertical stack of converter 200 can, for example, generate an electrical potential difference of about 0.5 mV. Multiple compound SQUIDs 204 can be stacked serially to create a larger total output voltage, OUTP-OUTN, across a load resistor $R_L$. Although the illustrated example of FIG. 2 shows only four rows, converter 200 can be provided with any number of rows by enlarging vine trees 208, 210 so as to output a desired voltage range, at the expense of circuit component duplication and chip area.

Figure 4:
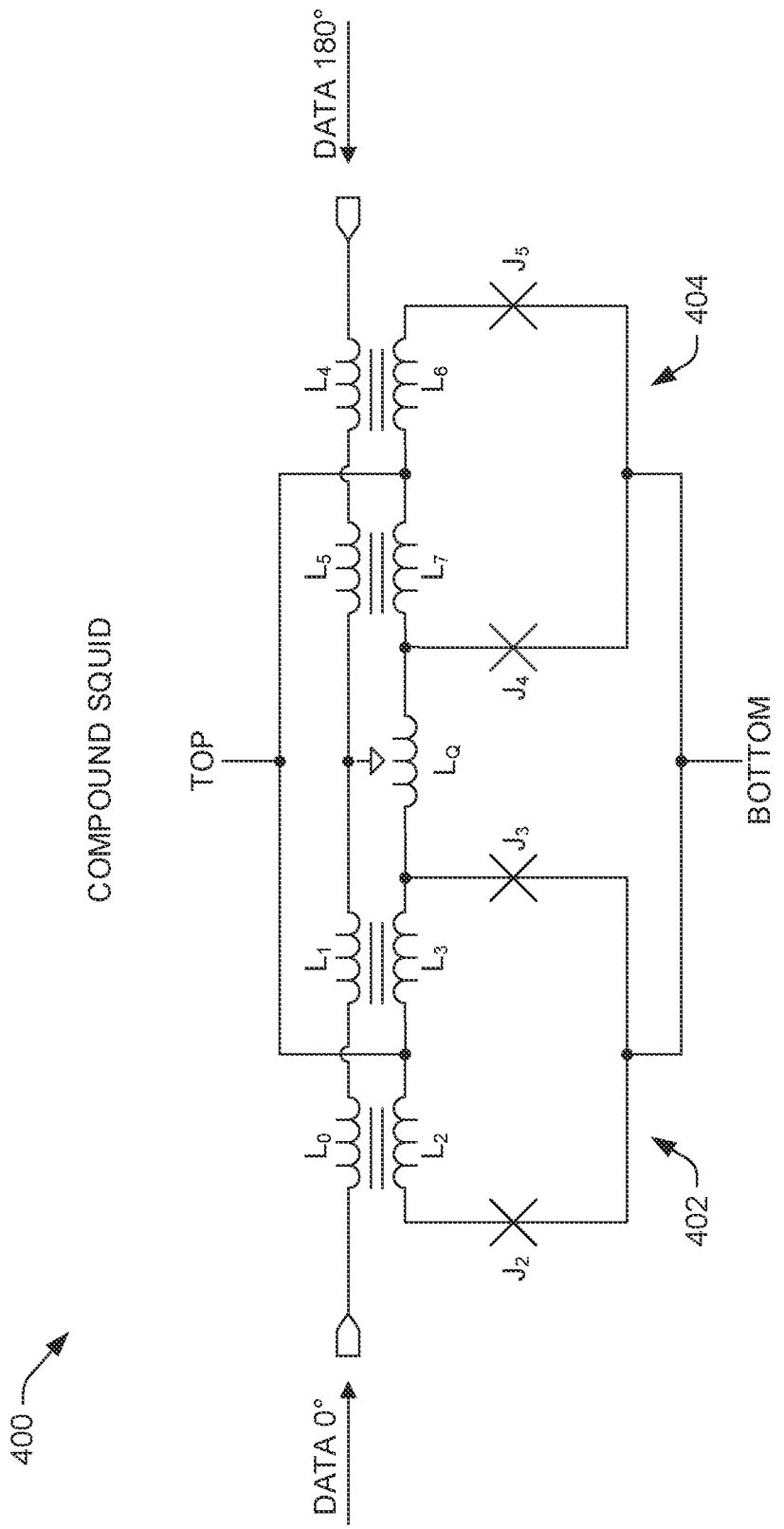
FIG. 4 is a schematic diagram of an example compound SQUID.

FIG. 4 is a schematic diagram of an example compound SQUID 400 as can be used for compound SQUID 204 in the converter 200 of FIG. 2. A data signal is provided to an input on the left, and a version of the data signal shifted about 180° is provided to an input on the right. Compound SQUID 400 includes two DC-SQUIDs 402, 404 connected via an inductor $L_Q$ that is sized so that either DC-SQUID cannot trigger the other. A potential difference is generated between nodes TOP and BOTTOM.

Figure 5:
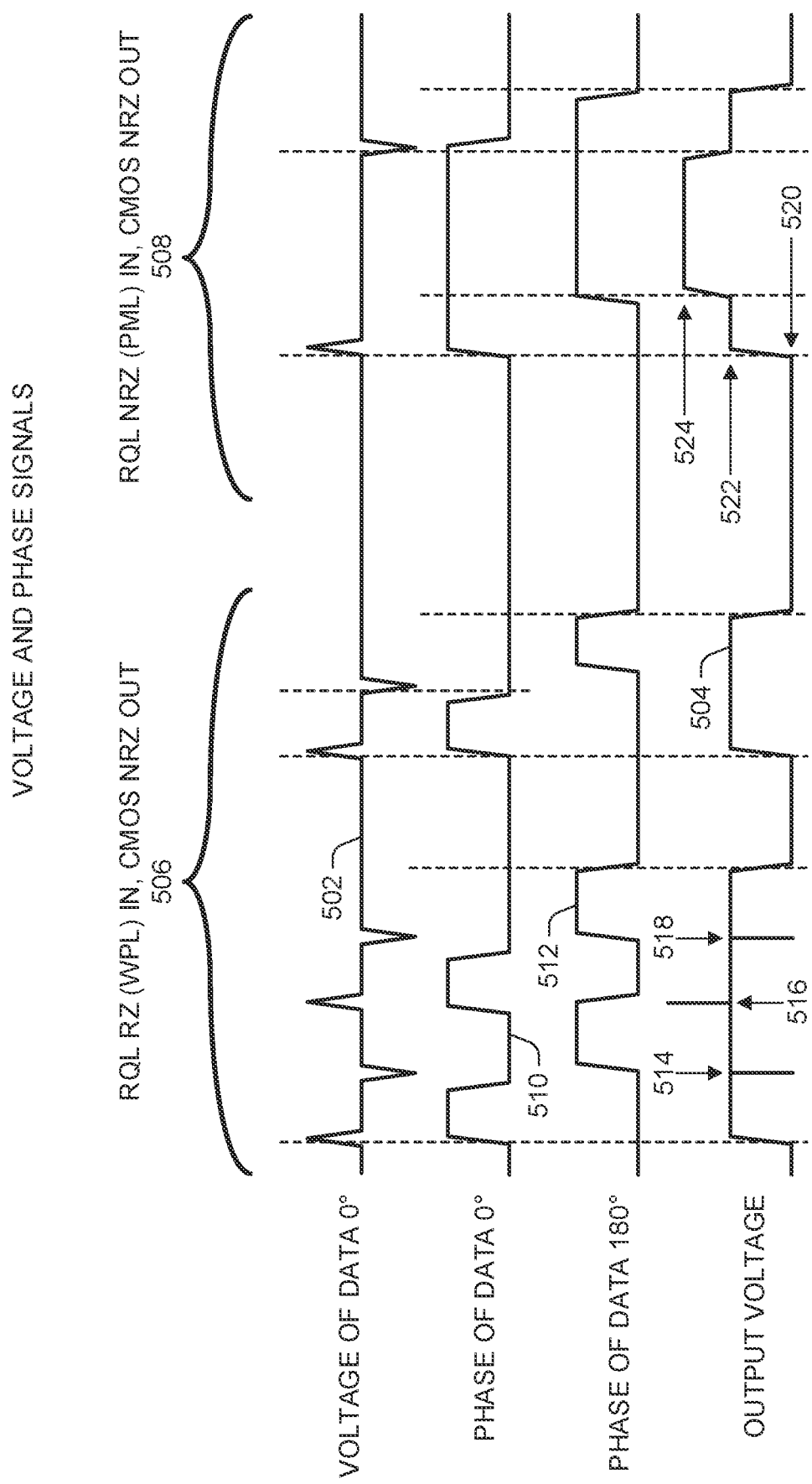
FIG. 5 is a timing diagram of example RQL RZ and RQL NRZ signals converted to CMOS NRZ using the converter of FIG. 2.

FIG. 5 is a timing diagram of example RQL RZ and RQL NRZ signals converted to CMOS NRZ using the converter 200 of FIG. 2. The graph of voltage and phase signals in FIG. 5 shows an example data input 502 and output 504 of an RQL-to-CMOS-NRZ converter having a time-domain addition circuit like the compound SQUID 400 shown in FIG. 4, for both RQL RZ input signals 506 (e.g., as found in WPL RQL circuitry) and RQL NRZ input signals 508 (e.g., as may be found in PML RQL circuitry). The first plot 502, showing SFQ pulses, represents an RQL input signal in the voltage domain. The input data signal 502, which is RZ during first time portion 506 and NRZ during a second time portion 508, is converted by converter 200 to a CMOS NRZ output data signal 504 by summing the output voltages of the two DC-SQUIDs 402, 404 connected as a compound SQUID 400. Within first time portion 502, there are two RZ pulse groups, a first RZ pulse group consisting of two reciprocal SFQ pulse pairs and a second RZ pulse group consisting of one reciprocal SFQ pulse pair.

The second plot 510 in FIG. 5 represents the RQL input signal of plot 502 in the phase domain, which is the integral of voltage. The third plot 512 represents the phase domain signal of plot 510 shifted by 180°, as may be performed, for example, using a JTL configured as an RQL signal phase shifter (not shown). The fourth plot 504 represents the time-domain logical sum of the second and third plots 510, 512, as may be performed by providing the signals of the second and third plots 510, 512 to the respective inputs illustrated on the left and right sides of the compound SQUID 400 shown in FIG. 4. As shown in FIG. 5, the output signal 504 rises upon the first rising edge of the 0° phase signal 510 in an RZ pulse group and falls upon the last falling edge of the 180° shifted phase signal 512 in the RZ pulse group.

Ideally, the generated time-domain sum 504 provides a CMOS NRZ output voltage signal, which can be amplified to suitable voltage levels for provision, for example, to CMOS circuitry or to other circuitry that uses a bilevel-voltage NRZ encoding scheme. However, practical circuit component and/or bias signal variations in the RQL-to-CMOS-NRZ conversion circuitry may result in glitches characterized by temporal duration gaps or spikes in the output voltage signal represented by plot 504, e.g., at phase boundaries 514, 516, and 518 in the illustrated example, where the falling edge of the 0° phase signal 510 does not perfectly temporally align with the rising edge of the 180° phase signal 512, or where the rising edge of the 0° phase signal 510 does not perfectly temporally align with the falling edge of the 180° phase signal 512. Such glitches can manifest as either negative or positive spikes in the output voltage signal represented by plot 504, and depending on their duration, amplitude, and timing, can have non-negligible effects on the output signal represented by plot 504, for example, where the gaps or spikes are of sufficient amplitude or duration to be considered as different signal levels by circuitry to which the output signal is provided. Such phase boundary glitches can be especially prominent for lower system frequencies and operating point variations.

As also shown in time portion 508 of FIG. 5, if one DC-SQUID 206, 402, 404 in the compound SQUID 204, 400 has flux applied while the other does not, the DC-SQUID without applied flux loads down the other DC-SQUID in the compound SQUID 204, 400, causing the output voltage for inputs that use PML signaling to have more than two output levels: a low output voltage level 520 when neither DC-SQUID has flux applied, a first high output voltage level 522 when a single DC-SQUID has flux applied, and a higher output voltage level 524 when both DC-SQUIDs 402, 404 have applied flux. This resultant three-level output signal does not comport with the bilevel voltage expectation of CMOS NRZ signaling. The phase-boundary glitches 514, 516, 518 that can appear when converting from RQL RZ signaling (e.g., from WPL circuitry), illustrated in first time portion 506, and the three-level output that can appear when converting from RQL NRZ signaling (e.g., from PML circuitry), illustrated in second time portion 508, illustrate disadvantages of the converter 200 of FIG. 2.

Figure 6:
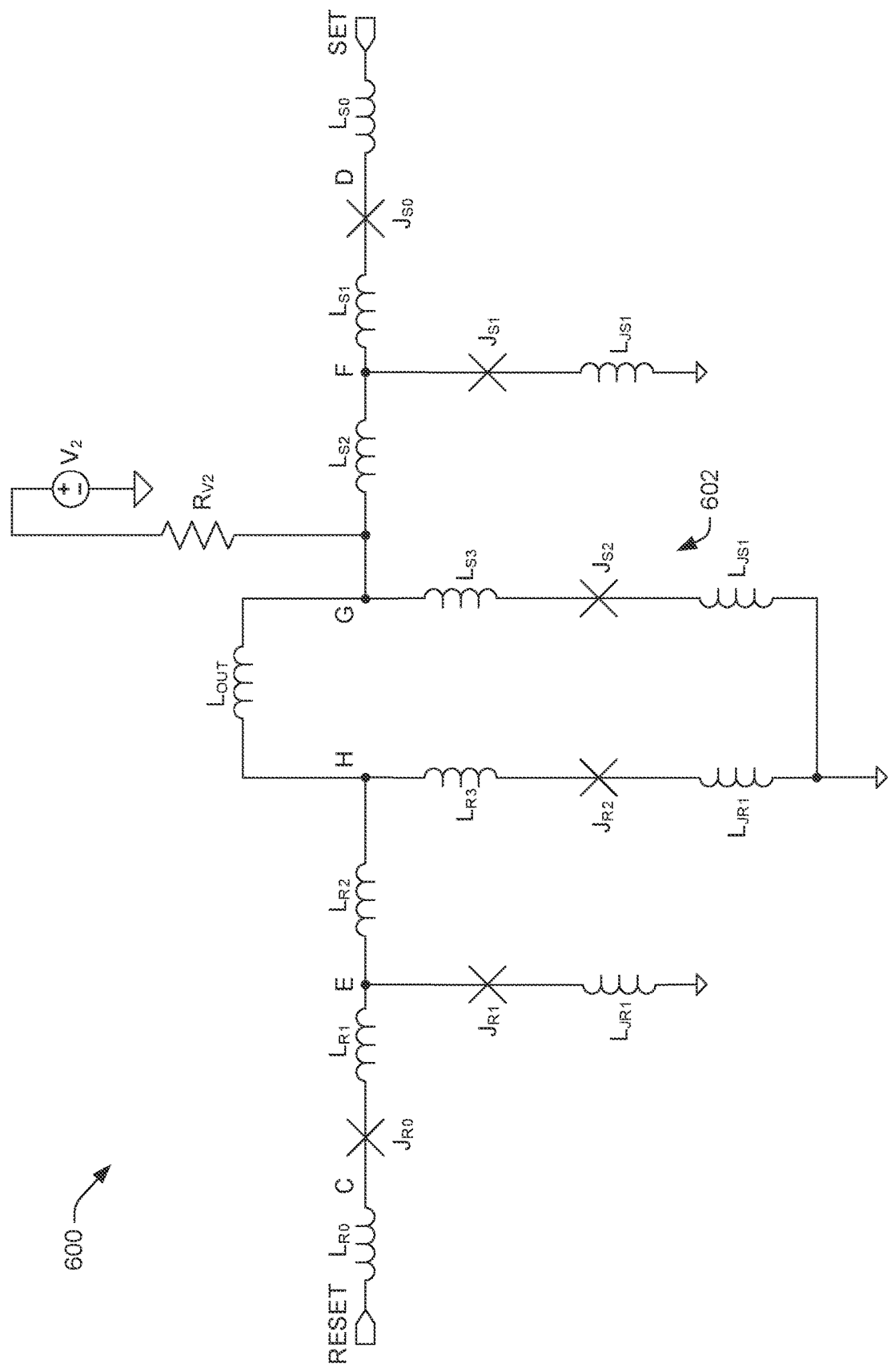
FIG. 6 is a schematic of an example implementation of an RZ-to-NRZ circuit for use in non-RQL systems, such as RSFQ systems.

FIG. 6 is a schematic of an example implementation of a state-based, edge-sensitive RZ-to-NRZ circuit 600 compatible with any of the DC-based (non-RQL) logic families, such as rapid single flux quantum (RSFQ). The structure of circuit 600 is configured to toggle the state of a controller DC-SQUID 602, distinct from the OA DC-SQUIDs 206, 402, 404, discussed above. The logic state of RZ-to-NRZ circuit 600 is held in controller DC-SQUID 602, which forms a set-reset (S-R) flip-flop. The existence of differing voltage states at nodes H and G results in a current flowing either one direction or the other direction through output inductor $L_{OUT}$. Current in circulating in the loop of controller DC-SQUID 602 can be used to drive the respective primary inductors of the transformers of the output DC-SQUIDs in the serially connected output stack. Thus, when circuit 600 is used in an RZ-to-NRZ converter, output inductor $L_{OUT}$ in circuit 600 can correspond to primary inductors $L_0, L_1, L_4, L_5$ in compound SQUID 400 of FIG. 4. Edges of an RZ SFQ-pulse-based input signal and a 180°-delayed version of this input signal can be provided as SET and RESET signals, respectively, to this controller DC-SQUID 602 to provide state-based, edge-sensitive operation.

Figure 7:
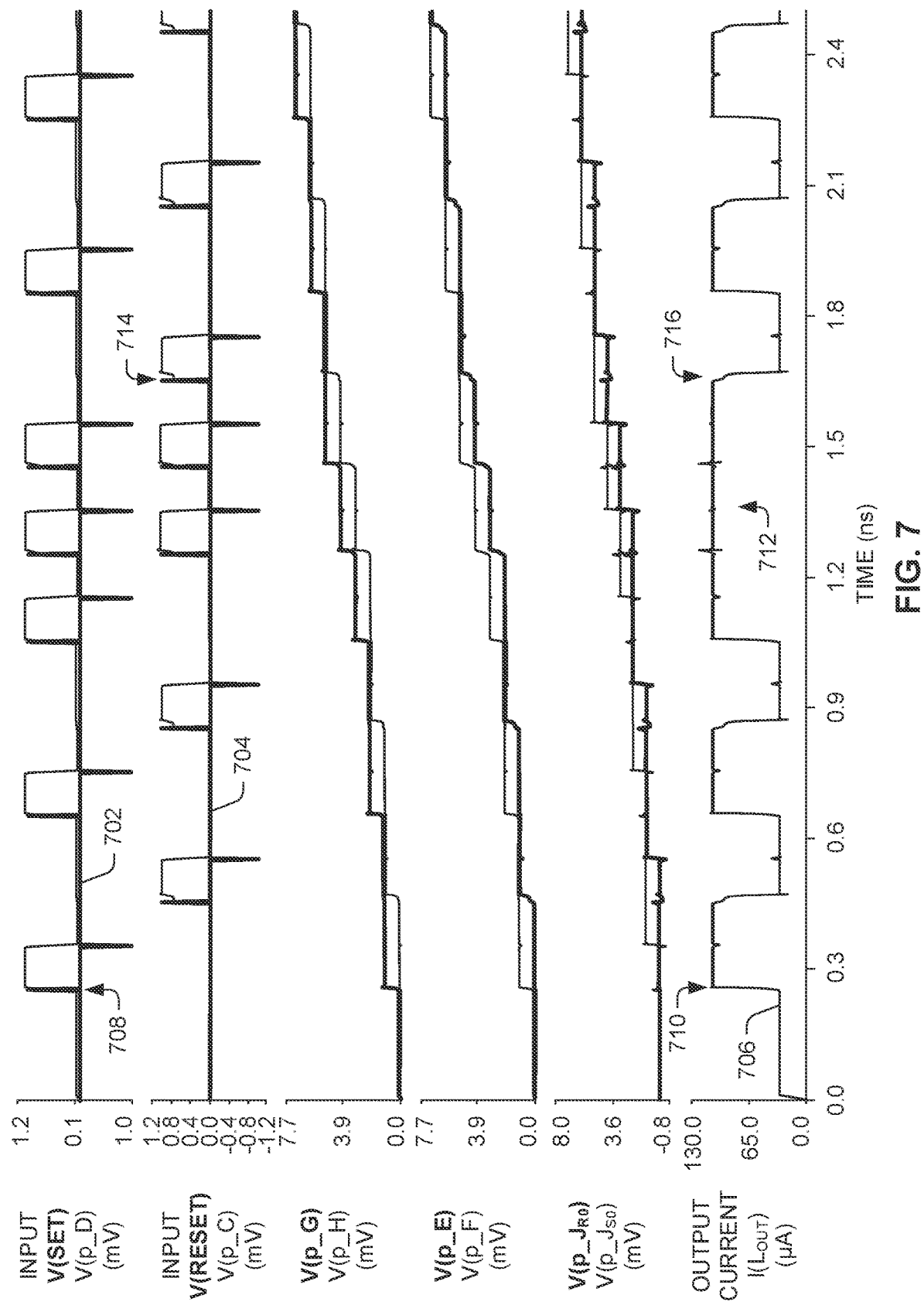
FIG. 7 is a timing diagram illustrating the operation of the circuit of FIG. 6.

The simulated timing diagram of FIG. 7 illustrates the functioning of circuit 600. FIG. 7 shows the voltage of a SET signal 702, a corresponding RESET voltage signal 704 that is time-shifted from the SET signal 702, and an output current signal 706 provided through $L_{OUT}$. In superconducting phase plots in FIG. 7 (indicated by "p_" in the vertical axis legend), superconducting phase is translated to units of millivolts ($2\pi$=1 mV). A first positive SFQ pulse 708 provided to the SET input on the right of circuit 600, sets the S-R flip-flop circuit formed by loop 602 and causes the output current signal 706 to go high 710. Input pulses provided to the SET input are delayed (e.g., by about 180°) and provided to the RESET input on the left of circuit 600. Such delay may be performed, for example, using a JTL configured as an RQL signal phase shifter (not shown). Extended NRZ output pulse 712 shows that after a first SET pulse, subsequent sequential input pulses perform a fast set-reset operation and do not affect the output 706, provided that the sequential input pulses meet timing constraints. A final positive SFQ pulse 714 provided on the RESET input 704 resets the circuit 600, causing the output 706 current to go low 716. Relating the SFQ inputs 702, 704 to the output current 706 shows the RZ-to-NRZ conversion resulting from the held state and edge relationships. However, circuit 600 cannot be directly integrated into an RQL design due to the DC current supplied by the voltage source $V_2$ in the schematic of FIG. 6.

Figure 8:
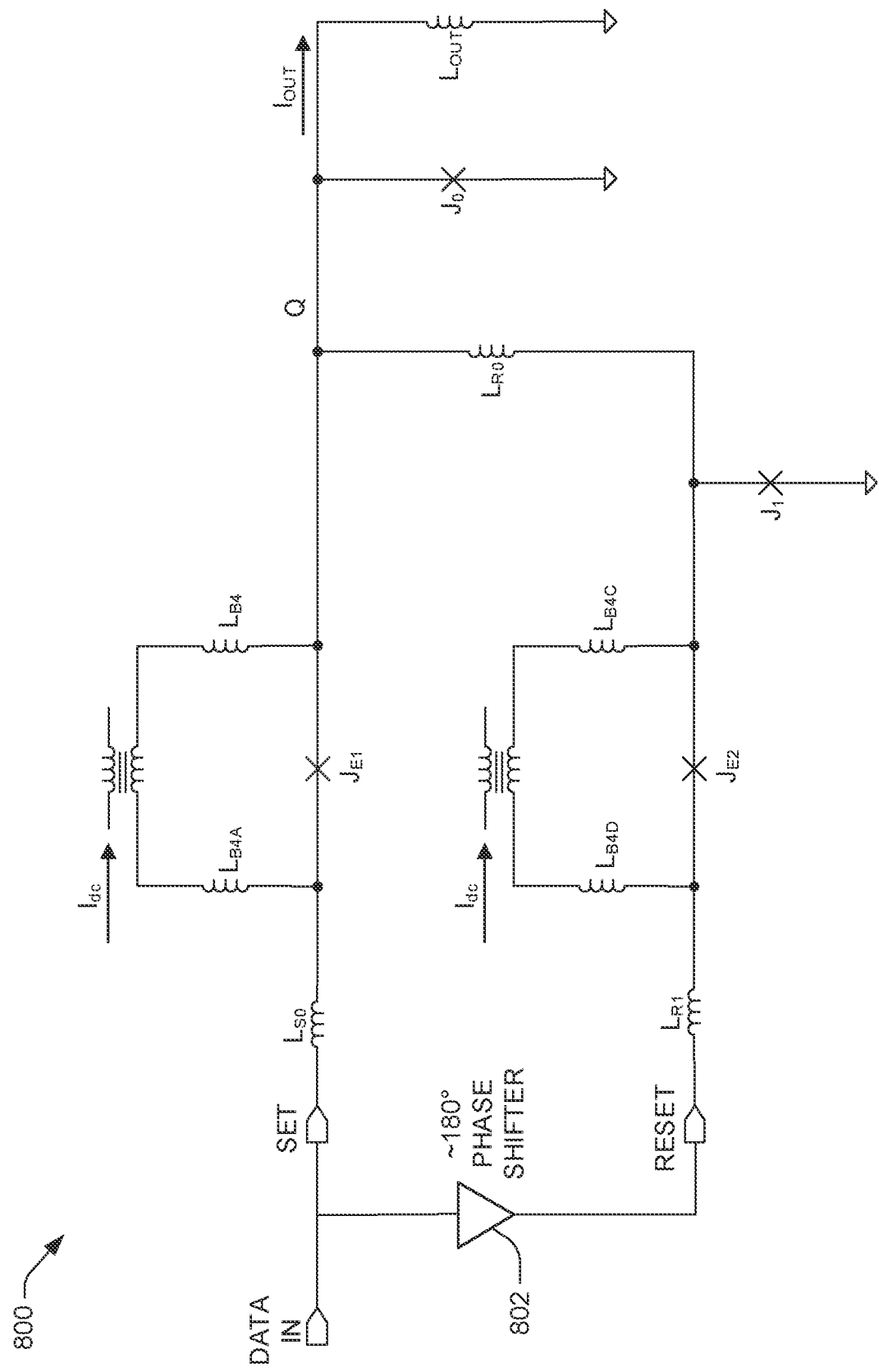
FIG. 8 is a schematic of an example implementation of an RZ-to-NRZ circuit for use in RQL systems.

FIG. 8 shows a first example RQL implementation of an RZ-to-NRZ circuit 800. An SFQ signal provided at node DATA IN is provided to the SET input and is shifted by about 180° for provision to the RESET input by phase shifter 802. A phase signal at node Q provides the output state of the RZ-to-NRZ circuit 800. A first SFQ pulse provided to the SET line triggers escape JJ $J_{E1}$, setting the superconducting phase at output node Q to $2\pi$ radians. A first SFQ pulse provided to the RESET line triggers escape JJ $J_{E2}$, which is biased to an AC clock phase 180° opposite that to used to bias SET-line escape JJ $J_{E1}$. Subsequent pulses, positive or negative, on either the SET line or the RESET line, are effectively discarded and do not substantially affect the superconducting phase at output node Q, which remains high at $2\pi$ radians, until a last falling edge in a pulse group arrives on the RESET line, bringing the superconducting phase at output node Q low to 0 radians. Amplifying JJ $J_1$ on the RESET line serves to improve the operating margins of the circuit 800 and can be omitted in some examples. The phase signal at node Q cannot be buffered or transmitted with RQL JTLs without losing the NRZ edge/waveform information in the outputs signal. RZ-to-NRZ output current $I_{OUT}$ is provided through inductor $L_{OUT}$, which represents the equivalent inductive load of the flux coupling transformers, e.g., primary inductors $L_0, L_1$ in FIG. 3.

Figure 9:
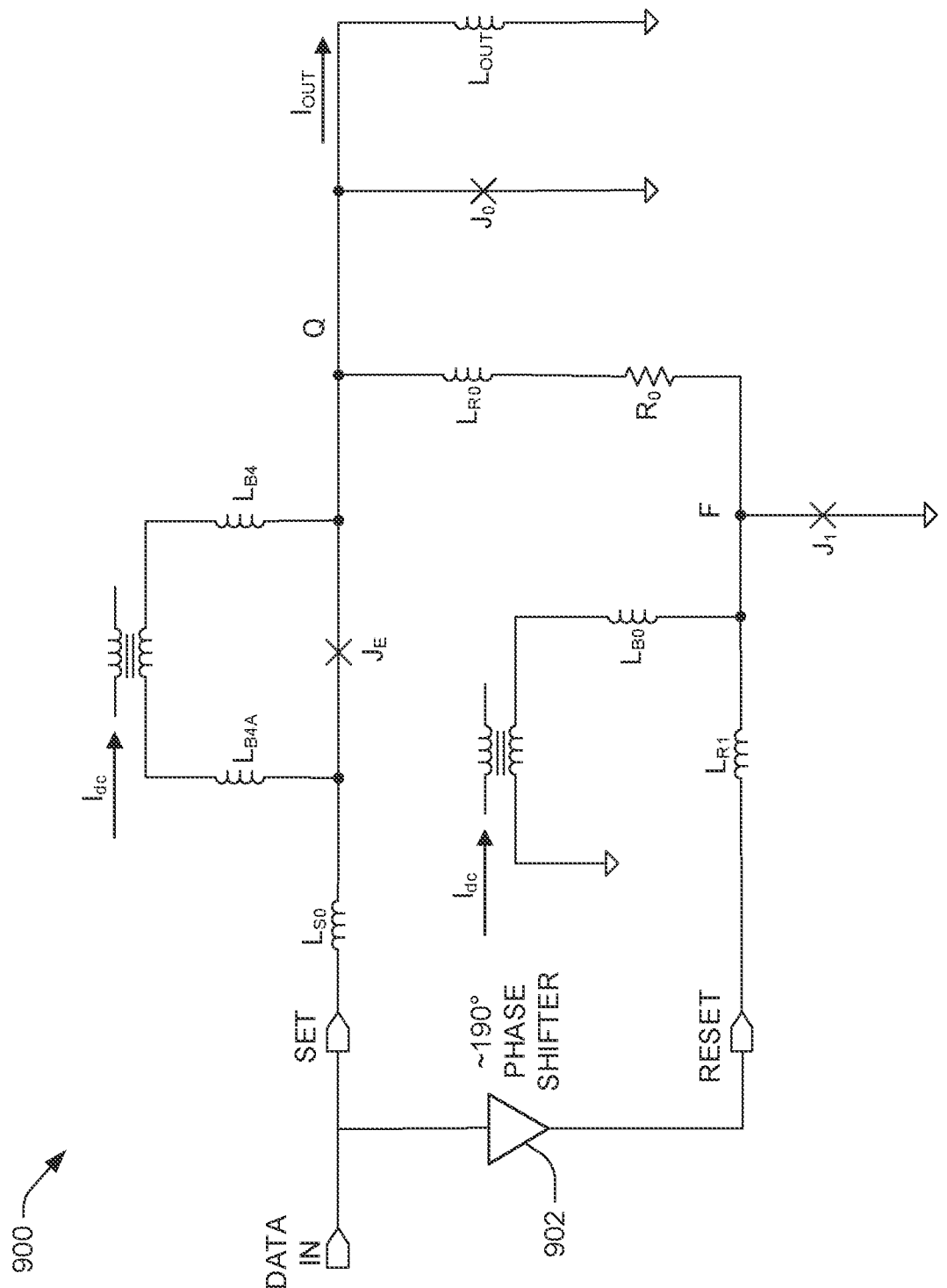
FIG. 9 is a schematic of another example implementation of an RZ-to-NRZ circuit for use in RQL systems.

FIG. 9 shows a second example RQL implementation of an RZ-to-NRZ circuit 900. Circuit 900 is structurally and functionally similar to circuit 800 of FIG. 8. For example, similarly to how phase shifter 802 can be provided in circuit 800, phase shifter 902 can be provided in circuit 900 to shift an SFQ signal provided at node DATA IN to the SET input by somewhat over 180°, e.g., between about 180° and about 225°, e.g., about 190°, for provision to the RESET input. Phase shifter 902 can, for example, be configured to provide input pulses provided to the RESET input version of the input pulses provided to the SET input that are shifted by an amount of time such that a first negative SFQ pulse provided to the RESET input, corresponding to and shifted in time from a first negative SFQ pulse provided to the SET input that is immediately subsequent to a first positive SFQ pulse provided to the SET input, is provided to the RESET input (a) after a second positive SFQ pulse provided to the SET input, immediately subsequent to the first negative SFQ pulse provided to the SET input, is provided to the SET input, and (b) before a second negative SFQ pulse provided to the SET input, immediately subsequent to the second positive SFQ pulse provided to the SET input, is provided to the SET input. However, as compared to circuit 800, circuit 900 omits the RESET-line escape JJ $J_{E2}$. Example circuit 900 also includes along the RESET line resistor $R_0$ (having a value of about 1Ω, e.g.) and inductor LR0 (having a value of about 1 pH, e.g.). RESET resistor Ro connecting node F to node Q can be included so that only the transient AC-coupled RESET current propagates through to node Q. Resistor $R_0$ thus effectively burns off (dissipates to heat) the RESET-line current when there is a phase difference between node F and node Q.

In circuit 900, an SFQ signal provided at node DATA IN is provided to the SET input and is shifted by, for example, about 190° for provision to the RESET input by phase shifter 902. A first SFQ pulse provided to the SET line triggers escape JJ $J_E$. Subsequent pulses are effectively discarded, and do not substantially affect the phase at output node Q, which remains high at $2\pi$ radians, until a last falling edge arrives on the RESET line, bringing the superconducting phase at output node Q low to 0 radians. RZ-to-NRZ output current $I_{OUT}$ is provided through inductor $L_{OUT}$, which represents the equivalent inductive load of the flux coupling transformers, e.g., primary inductors $L_0$, $L_1$ in FIG. 3.

Although circuits 600, 800, and 900 are referred to herein as RZ-to-NRZ circuits, these circuits are capable of converting either SFQ-pulse-based RZ signals or SFQ-pulse-based NRZ signals to CMOS NRZ.

Figure 10:
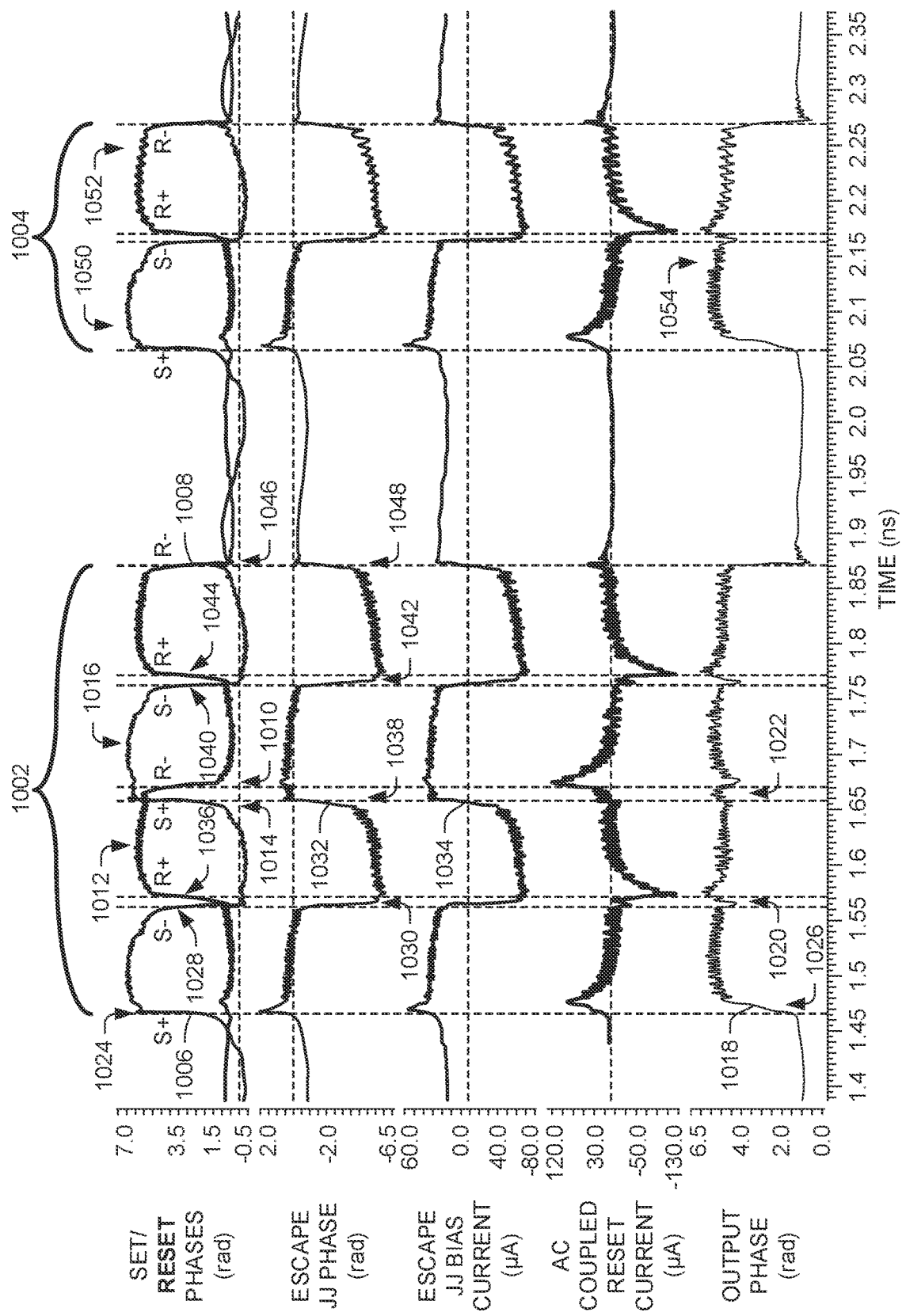
FIG. 10 is a timing diagram illustrating the operation of the circuit of FIG. 9.

The simulated timing diagram of FIG. 10 illustrates an example of operation of the circuit 900 of FIG. 9 for RZ signals. Two different RZ pulse groups 1002, 1004 are shown in the input-signal graph at the top of FIG. 10, a first RZ pulse group 1002 between about 1.46 ns and about 1.87 ns, and a second RZ pulse group 1004 between about 2.06 ns and about 2.27 ns. High-frequency ripples in the simulated signals of FIG. 10 are due to "kick-back" of output DC-SQUID oscillations through the flux coupling transformers (e.g., formed by inductors $L_0/L_2$, $L_1/L_3$, $L_5/L_7$, $L_4/L_6$ in FIG. 4 or 11). In FIG. 10, positive edges of the RQL SET SFQ phase signal 1006 are labeled S+, negative edges of the RQL SET SFQ phase signal 1006 are labeled S−, positive edges of RQL RESET SFQ phase signal 1008 are labeled R+, and negative edges RQL RESET SFQ phase signal 1008 are labeled R−.

As described above, the relative shift of the RESET phase signal 1008 with respect to the SET phase signal 1006 can be provided, via, for example, JTL phase shift circuitry, e.g., phase shifter 902 in FIG. 9, so that S+ edges of the SET phase signal 1006 arrive in time before corresponding R− edges of the RESET phase signal 1008 to satisfy a race condition that exists between S+ and R− signal edges in the design of circuit 900 and thus to guarantee correct functionality.

For example, a first negative SFQ pulse provided to the RESET input, causing falling phase edge 1010 in FIG. 10, can correspond to and be shifted in time from a first negative SFQ pulse provided to the SET input, causing falling phase edge 1028 in FIG. 10. This first negative SFQ pulse can be provided to the SET input immediately subsequent to the provision to the SET input of a first positive SFQ pulse that causes rising phase edge 1024. The first negative SFQ pulse provided to the RESET input, causing falling phase edge 1010, can be provided to the RESET input after a second positive SFQ pulse (causing rising phase edge 1014) is provided to the SET input, which second positive SFQ pulse is provided to the SET input immediately subsequent to the first negative SFQ pulse being provided to the SET input (causing falling phase edge 1028). The first negative SFQ pulse provided to the RESET input, causing falling phase edge 1010, can also be provided to the RESET input before a second negative SFQ pulse (causing falling phase edge 1040) is provided to the SET input, which second negative SFQ pulse is provided to the SET input immediately subsequent to the second positive SFQ pulse being provided to the SET input (causing rising phase edge 1014).

For example, the RESET phase signal 1008 can be shifted slightly more than 180° from the SET phase signal 1006, e.g., between about 180° and about 225°, e.g., about 190°. In the illustrated example, the falling edge 1010 of the first pulse 1012 of the RESET phase signal 1008, at about 1.67 ns, is substantially delayed, by about 0.2 ns, after the rising edge 1014 of the second pulse 1016 of the SET phase signal 1006, the SET+, meaning that the race condition is satisfied, because each S+ edge within an RZ pulse group arrives temporally before each R+ edge within the same RZ pulse group. Satisfaction of the race condition can be, for example, enforced schematically by including JTL delay, as, for example, is provided by JTL phase shifter 902 in circuit 900 of FIG. 9, or can be obviated by including an escape JJ in both the SET and RESET paths, as in circuit 800 of FIG. 8.

As shown in FIG. 10, the circuit 900 of FIG. 9 correctly translates the RQL NRZ signal represented in phase form by SET input plot 1006 into an NRZ output phase signal (e.g., representative of the phase at node Q in FIG. 9) represented by output plot 1018. An OA coupled to the output of circuit 900 can, for example, convert this output phase signal 1018 into a voltage signal of a desired high voltage level. The temporally brief, amplitude-limited drop in phase amplitude at what appears to be a gap-type glitch 1020 in the output 1018 at about 1.56 ns is caused by the first negative SET phase signal edge (the first S−) triggering the escape JJ $J_E$ in circuit 900, resulting in a brief phase transient, controllable by the speed of reset of the phase on bias escape JJ $J_E$ in circuit 900 of FIG. 9. By contrast to gap-type glitches potentially caused in converter 200 of FIG. 2, examples of which are illustrated at 514 and 518 in FIG. 5, glitch 1020 is insubstantially small in phase amplitude and is not capable of being low enough in phase amplitude to result in a low voltage at the OA output that could be confused, by circuitry connected to the OA output, as a logical low signal condition. Similarly, the temporally brief, amplitude-limited rise in phase amplitude at what appears to be a potential spike-type glitch 1022 in the output 1018 at about 1.67 ns is insufficient in amplitude to result in an excessively high voltage at the OA output that could be confused, by circuitry connected to the OA output, as a third voltage level condition, in contrast to spike 516 illustrated in FIG. 5.

Because of the initial biasing conditions surrounding escape JJ $J_E$ in circuit 900 of FIG. 9, escape JJ $J_E$ in circuit 900 is transparent to an initial SFQ pulse introduced into the DATA IN node of circuit 900, and thus into the SET node in circuit 900 of FIG. 9. This initial SFQ pulse thus passes along the SET line toward node Q, and is represented by the first S+ edge 1024 in SET phase signal 1006 at about 1.47 ns in FIG. 10, which triggers JJ $J_0$ in FIG. 9, bringing the superconducting phase at node Q from 0 radians to $2\pi$ radians and thus causing the first rising edge 1026 in the output phase signal 1018. At about 1.56 ns, the first S− edge 1028 in SET phase signal 1006 triggers 1030 the escape JJ $J_E$ in FIG. 9, as shown in escape JJ phase plot 1032 and escape JJ bias current plot 1034, and does not substantially affect the output phase signal 1018 (the phase at node Q in circuit 900 of FIG. 9).

At about 1.57 ns in FIG. 10, the first R+ edge 1036 in RESET phase signal 1008 triggers JJ $J_1$ in FIG. 9, bringing the superconducting phase at node at F in circuit 900 in FIGS. 9 to $2\pi$ radians, not substantially affecting the output phase signal 1018 because the superconducting phase at node Q is already at $2\pi$ radians. At about 1.66 ns, the second S+ edge 1014 in SET phase signal 1006 de-triggers 1038 the escape JJ $J_E$ in circuit 900 of FIG. 9, making the SET line once again transparent to phase between the input node SET and the output node Q. At about 1.67 ns, the first R− edge 1010 in RESET phase signal 1008 does not cause a falling edge in output phase signal 1018 because a $2\pi$ superconducting phase at node Q is maintained by node Q's tie to the $2\pi$ superconducting phase at the SET input node through the de-triggered escape JJ $J_E$ in circuit 900 of FIG. 9. By contrast, the superconducting phase at node Q is not tied to the superconducting phase at the RESET input node in circuit 900 because of the existence of resistor $R_0$. Node Q in circuit 900 takes on the same superconducting phase as that at the SET input node as long as the tie between nodes Q and SET is not blocked by the escape JJ $J_E$ having been triggered. At the time of the first R− edge 1010, the escape JJ $J_E$ has been de-triggered 1038 (the escape JJ phase signal 1032 is high).

At about 1.76 ns in FIG. 10, the second S− edge 1040 in SET phase signal 1006 results in a duplicate circuit state as that of the first S− edge 1028 at about 1.65 ns, in which the escape JJ $J_E$ in circuit 900 of FIG. 9 is triggered 1042 and no substantial change to the output phase 1018 is effected. At about 1.77 ns in FIG. 10, the second R+ edge 1044 in RESET phase signal 1008 results in a duplicate circuit state as that of the first R+ edge 1036 at about 1.57 ns, in which JJ $J_1$ in FIG. 9 is triggered and, again, no substantial change to the output phase 1018 is effected. Unique circuit states are only noted at about 1.47 ns (first S+ edge 1024), at about 1.56 ns (first S− edge 1028 followed by first R+ edge 1036), at about 1.66 ns (second S+ edge 1014 followed by first R− edge 1010), and at about 1.87 ns. At about 1.87 ns in FIG. 10, the second and final R− edge 1046 of the first RZ pulse group 1002 arrives. This second R− edge 1046 is not preceded by an S+ edge, but instead, only by the second S− edge 1040 at about 1.76 ns. Second R− edge 1046 effectively annihilates the positive 2π superconducting phase at node Q and de-triggers 1048 the escape JJ $J_E$ in circuit 900 of FIG. 9. This is because the negative SFQ pulse, corresponding to phase drop 1046 at the RESET input, propagated from the RESET input and to node F in circuit 900 of FIG. 9 with JJ $J_1$ serving as a signal repeater, pulls down the superconducting phase at node Q, which also pulls down the phase 1032 across the escape JJ $J_E$. By contrast, at about time 1.67 ns, when the first R− edge 1010 arrives, the SET phase signal 1006 is high at a 2π radian superconducting phase, the escape JJ $J_E$ is untriggered 1038, and therefore, the output node Q also remains at the same high 2π radian superconducting phase.

Second RZ pulse group 1004 demonstrates that the circuit 900 functions properly for a single input pulse, represented by SET phase signal 1006 pulse 1050 and corresponding delayed RESET phase signal 1008 pulse 1052 being converted into NRZ output 1054 at the output phase signal 1018. The first S+, S−, and R+ phase transitions in second RZ pulse group 1004, at about 1.07 ns, about 2.16 ns, and about 2.17 ns, respectively, produce similar results as the first S+, S−, and R+ phase transitions 1024, 1028, 1036 in the first RZ pulse group 1002. The first and final R− phase transition in second RZ pulse group 1004, at about 2.27 ns in FIG. 10, produce the same results as the second and final R− phase transition 1046 in the first RZ pulse group 1002.

Figure 11:
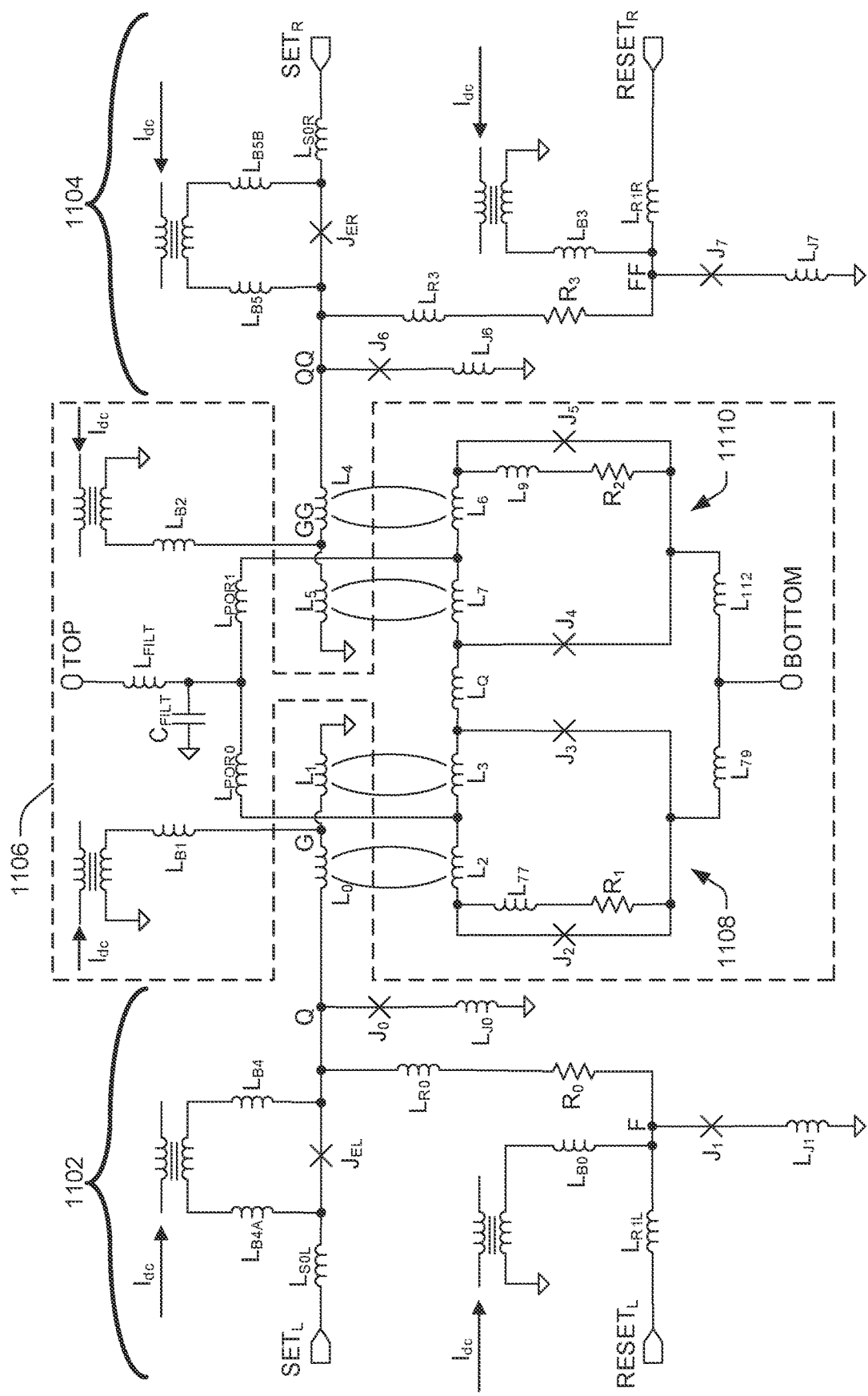
FIG. 11 is a schematic of an example implementation of a single row of an RQL RZ and RQL NRZ to CMOS NRZ converter.

The schematic of FIG. 11 shows an example implementation of a single row 1100 of an RQL RZ and RQL NRZ to CMOS NRZ converter. Two RZ-to-NRZ circuits 1102, 1104 are implemented on either side of a corresponding row 1106 of an OA, and are transformer-coupled to OA row 1106. OA row 1106 comprises the DC-SQUID loops 1108, 1110 used to generate the output voltages in the OA, between nodes TOP and BOTTOM in the portion 1100 of the OA shown. Circuits 1102, 1104 take on similar form to the circuit 900 shown in FIG. 9 and each function as discussed with regard to the timing diagram of FIG. 10, with output inductor $L_{OUT}$ of FIG. 9 corresponding to primary inductors $L_0$, $L_1$ of circuit 1102 or primary inductors $L_4$, $L_5$ of circuit 1104. The compound SQUID of OA row 1106 functions as described above with regard to FIG. 4. The same input signal can be provided to both input nodes $SET_L$ and $SET_R$, and can be time-shifted (e.g., by between about 180° and 225°, e.g., about 190°) for provision to input nodes $RESET_L$ and $RESET_R$, e.g., using a JTL-based shifter (not shown in FIG. 11). In some examples (not shown in FIG. 11), one circuit 1102 or 1104 can be used to drive both DC-SQUIDs 1108, 1110 of OA row 1106. In such examples, the output inductor line from a single circuit 1102 or 1104 would extend to encompass all four primary inductors $L_0$, $L_1$, $L_4$, $L_5$. In other examples, such as the one shown in FIG. 11, in which one circuit 1102 or 1104 is unable to generate sufficient flux at node Q (or corresponding node QQ) to drive all four secondary inductors $L_2$, $L_4$, $L_6$, $L_7$ of both DC-SQUIDS 1108, 1110, the circuits 1102, 1104 can be duplicated on both sides of the OA row 1106. As described above, multiple rows 1100 can be stacked on top of each other, with the BOTTOM node of one row coupled to the TOP node of a row below it, to provide a desired output voltage.

Figure 12:
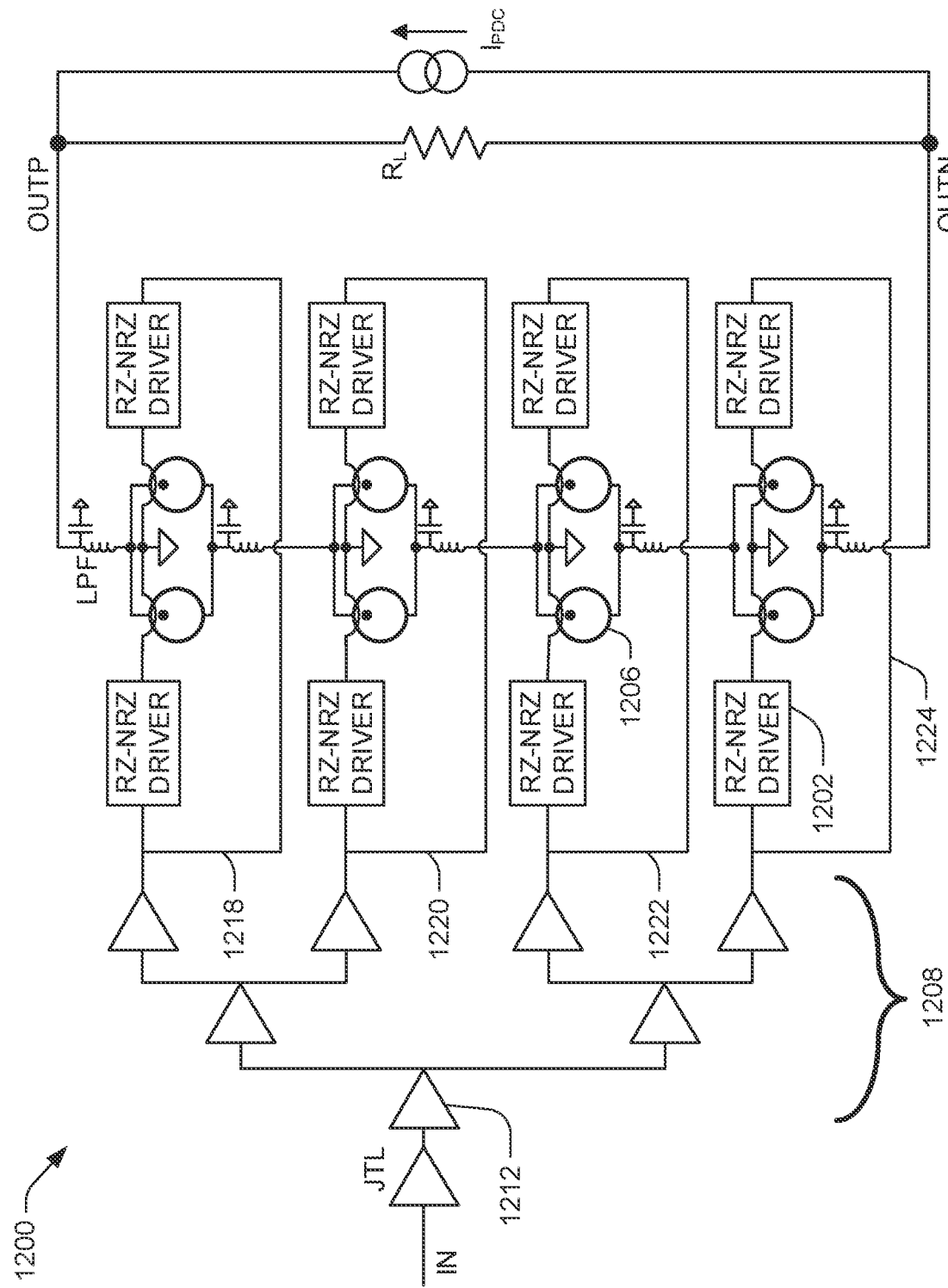
FIG. 12 is a block diagram of an example RQL RZ and RQL NRZ to CMOS NRZ converter.

FIG. 12 illustrates an example SFQ RZ and SFQ NRZ to CMOS NRZ converter 1200 similar in structure and function to converter 200 of FIG. 2, but with RZ-NRZ drivers 1202 comprising circuits like those of circuits 600, 800, or 900. Each driver 1202 can further include other JTL-based amplification circuitry, such as may be found in drivers 202 in converter 200 of FIG. 2. Whereas the converter 200 of FIG. 2 included two JTL vine trees 208, 210, one on each side, to split and distribute both an input signal and a delayed version of the input signal to the drivers 202, by providing for input signal delay within individual drivers 1202, converter 1200 of FIG. 12 includes only a single JTL vine tree 1208, offering better circuit component economy. Converter 1200 can accept an RZ or an NRZ SFQ-based signal as an input and provide a CMOS NRZ output across load resistor $R_L$ as a voltage signal. Thus, the input to converter 1200 can be a wave-pipelined RQL signal or it can be phase-mode RQL signal.

Figure 13:
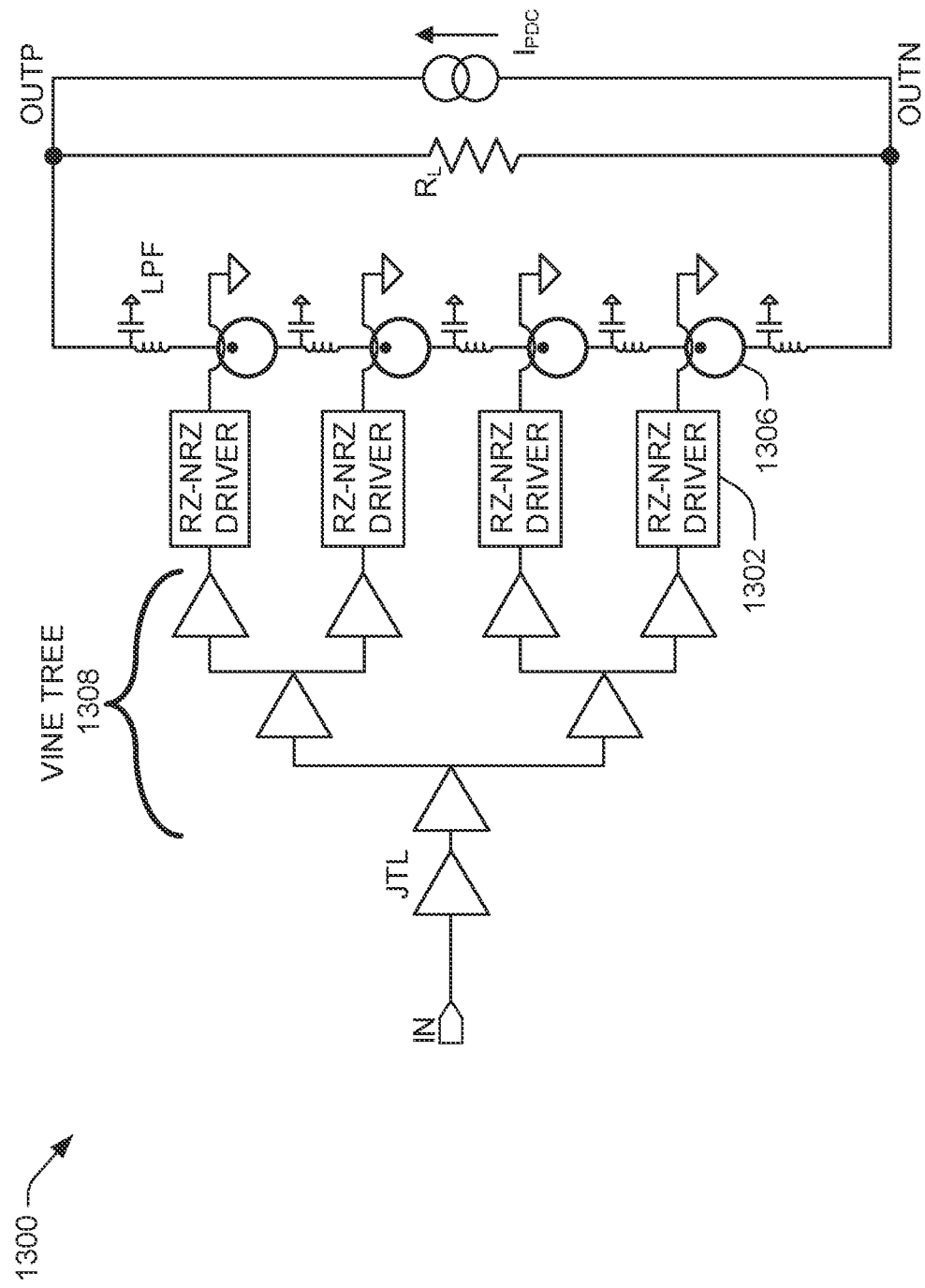
FIG. 13 is a block diagram of another example RQL RZ and RQL NRZ to CMOS NRZ converter.

FIG. 13 illustrates an alternate example SFQ RZ and SFQ NRZ to CMOS NRZ converter 1300, in which RZ-NRZ drivers are not provided on both sides of converter 1300, but only on one side, and drive single DC-SQUIDs 1306 in each row of the OA. In the example converter 1300 of FIG. 13, as in FIG. 12, only a single JTL vine tree 1308 is provided.

Figure 14:
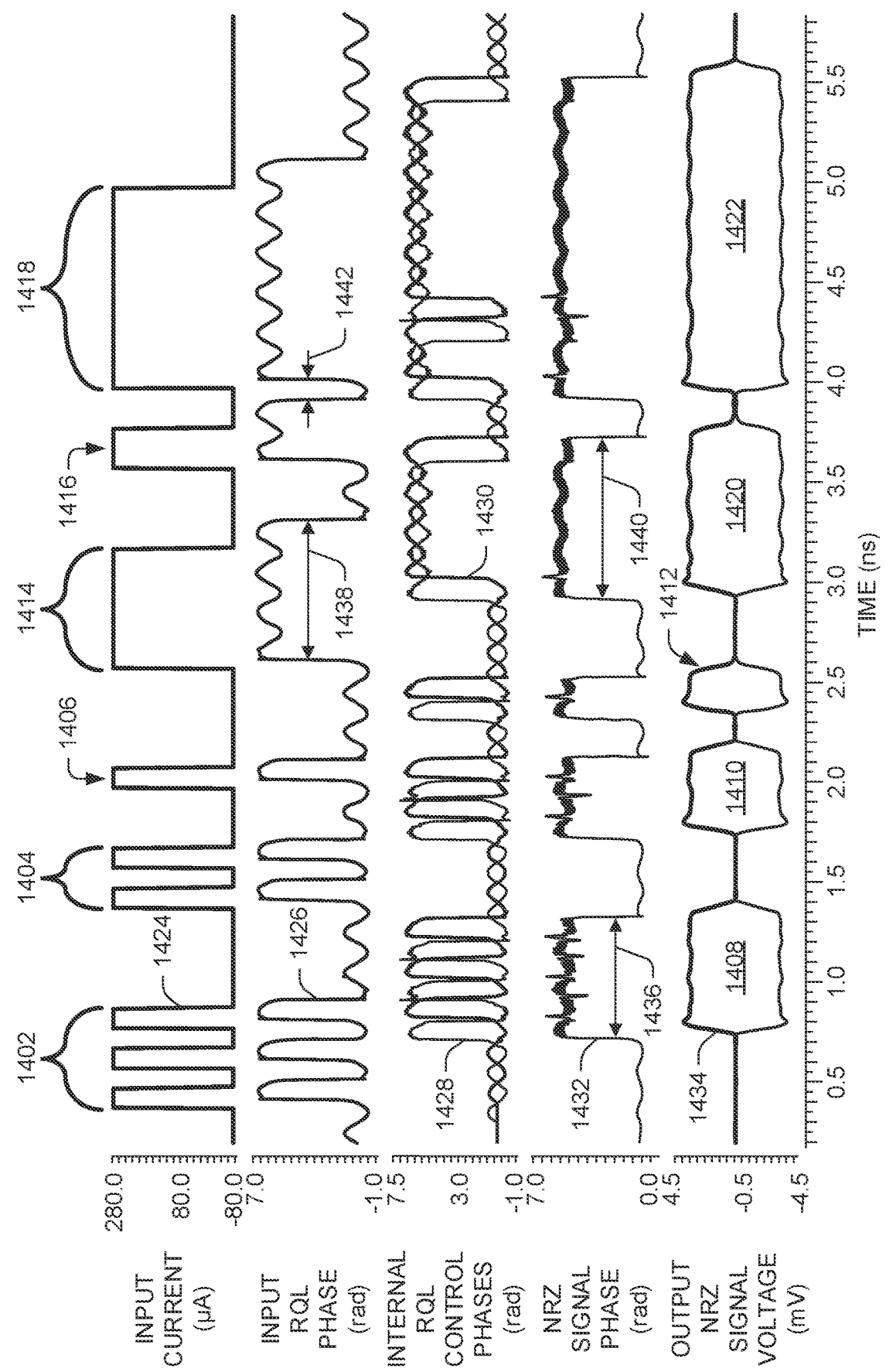
FIG. 14 is a timing diagram illustrating the operation of an RQL RZ and RQL NRZ to CMOS NRZ converter such as illustrated in FIG. 12.

The simulated timing diagram of FIG. 14 illustrates an example of operation of an RQL RZ and RQL NRZ to CMOS NRZ converter such as illustrated in FIG. 12. A first input RZ pulse group 1402 consisting of three input RZ pulses, a second input RZ pulse group 1404 consisting of two input RZ pulses, and a lone input RZ pulse 1406 are converted into CMOS NRZ voltage outputs 1408, 1410, and 1412, respectively. A first RQL NRZ input 1414 is converted into a CMOS NRZ voltage output 1420. A brief RQL NRZ pulse 1416 and a subsequent longer RQL NRZ pulse 1418 are converted into a CMOS NRZ voltage output 1422. Input current signal 1424 is provided by an ideal current source in a testbench. An input receiver (not shown) converts input current signal 1424 into input RQL phase signal 1426, with some associated amount of time delay. Input RQL phase signal 1426 is provided as an RQL input to the converter (e.g., converter 1200 of FIG. 12). Input RQL phase signal 1426 results (after some time delay from distribution within the circuit, JTL vine tree distribution, and RESET signal phase shift) in internal RQL control phase signals SET 1428 and RESET 1430. As in the previously described examples, RESET phase signal 1430 is shifted about 180° from SET phase signal 1428, e.g., between about 180° and about 225°, e.g., about 190°. The SET and RESET phase signals 1428, 1430 are converted by RZ-NRZ circuitry (e.g., circuitry that includes circuit 900 of FIG. 9) into an NRZ output phase signal 1432 signal, which is subsequently converted using a stacked OA arrangement as described above, for example, with regard to FIGS. 2 and 12, into an output CMOS NRZ voltage signal 1434. Small glitches in the NRZ phase signal 1432 disappear in the output CMOS NRZ voltage signal 1434 with the filter averaging provided by the inter-row low-pass filters of OA stack.

The RQL RZ to CMOS NRZ functioning of the converter the operation of which is shown in FIG. 14 up to about time 2.6 ns has been described above with regard to FIG. 10. For example, RZ pulse group 1402 in the input signals 1424, 1426 translates into high phase timespan 1436 in the NRZ phase signal 1432 (e.g., the phase at node Q in FIG. 9) and subsequently into CMOS NRZ voltage pulse 1408 in output voltage signal 1434 after phase-to-voltage conversion by the OA stack. Starting at about 2.6 ns, however, FIG. 14 shows applying PML signaling (RQL NRZ), having no intermediate return to zero. NRZ high phase timespan 1438 in input RQL phase signal 1426, for example, represents an about 1.6 ns long PML pulse 1414 on RQL boundaries with a half-cycle extension. This high phase 1436 translates, in the NRZ phase signal 1432, into high phase span 1440 and, after OA conversion, into CMOS NRZ pulse 1420 in converter output voltage signal 1434. By contrast, pulses 1416, 1418 in input current signal 1424 translate into a single long NRZ pulse 1422 because the low-phase gap 1442 in input RQL phase signal 1426 does not last a full AC clock cycle.

Figure 15:
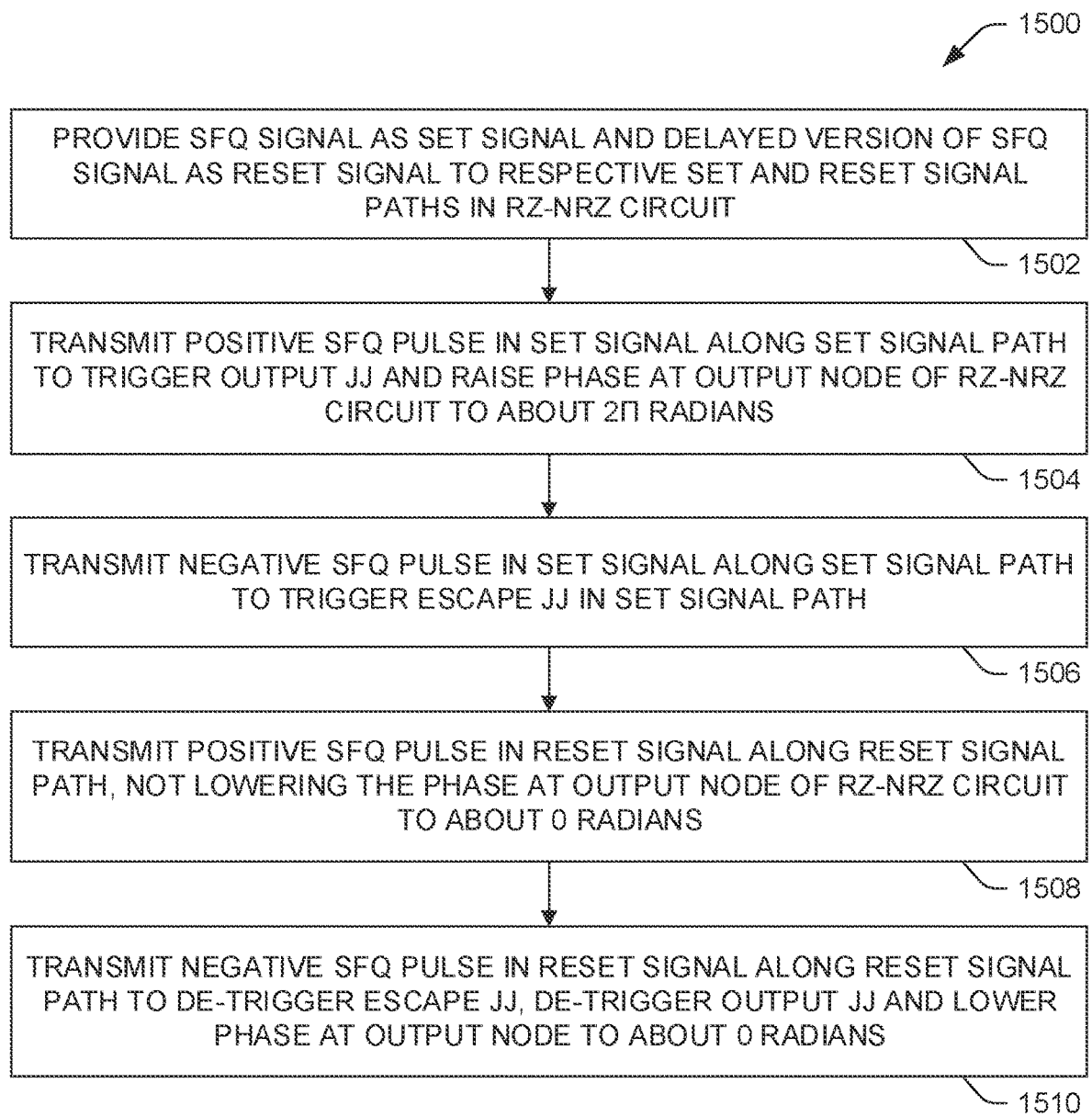
FIG. 15 is a flow diagram of an example method for converting RQL RZ signaling and RQL NRZ signaling to CMOS NRZ signaling.

The flow diagram of FIG. 15 illustrates an example method 1500 for converting RQL RZ signaling and RQL NRZ signaling to CMOS NRZ signaling. An SFQ signal is provided 1502 as a SET signal, and a delayed version of the SFQ signal is provided 1502 as a RESET signal to respective SET and RESET signal paths in an RZ-NRZ circuit, such as the RZ-NRZ circuits 800 or 900 shown in FIG. 8 or 9, wherein the SET and RESET paths dovetail at output node Q. A positive SFQ pulse in the SET signal is transmitted 1504 along the SET signal path to trigger an output JJ (e.g., JJ $J_0$ in circuits 800 or 900) and raise the phase at an output node (e.g., node Q in circuits 800 and 900) of the RZ-NRZ circuit to about $2\pi$ radians. A negative SFQ pulse in the SET signal is transmitted 1506 along the SET signal path to trigger an escape JJ (e.g., $J_{E1}$ in circuit 800 or $J_E$ in FIG. 900) that is in the SET signal path. A positive SFQ pulse in the RESET signal is transmitted 1508 along the RESET signal path, which SFQ pulse does not lower the phase at the output node of the RZ-NRZ circuit to about 0 radians. A negative SFQ pulse in the RESET signal is transmitted 1510 along the RESET signal path to de-trigger (trigger in a direction opposite the initial triggering) the escape JJ, de-trigger the output JJ, and lower the phase at the output node to about 0 radians. The phase of this output node can be converted, for example, to a voltage signal of a desired high voltage level by an OA.

Figure 16:
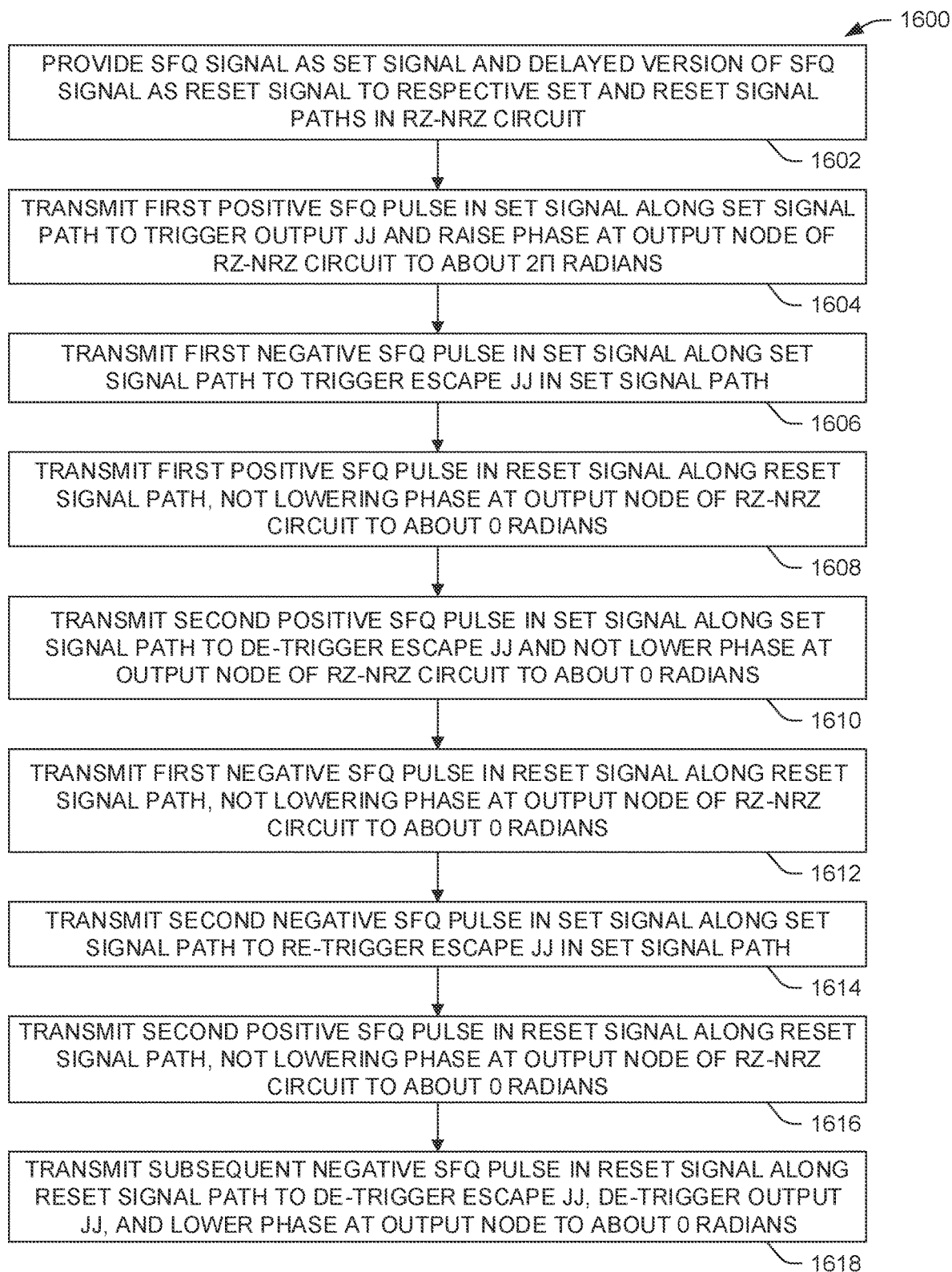
FIG. 16 is a flow diagram of another example method for converting RQL RZ signaling and RQL NRZ signaling to CMOS NRZ signaling.

The flow diagram of FIG. 16 illustrates another example method 1600 for converting RQL RZ signaling and RQL NRZ signaling to CMOS NRZ signaling. An SFQ signal is provided 1602 as a SET signal and a delayed version of the SFQ signal is provided 1602 as a RESET signal to respective SET and RESET signal paths in an RZ-NRZ circuit, such as the RZ-NRZ circuits 800 or 900 shown in FIG. 8 or 9, wherein the SET and RESET paths dovetail at output node Q. A first positive SFQ pulse in the SET signal is transmitted 1604 along the SET signal path to trigger an output JJ (e.g., JJ $J_0$ in circuits 800 or 900) and raise phase at the output node (e.g., node Q in circuits 800 and 900) of the RZ-NRZ circuit to about $2\pi$ radians. A first negative SFQ pulse in the SET signal is transmitted 1606 along the SET signal path to trigger an escape JJ (e.g., $J_{E1}$ in circuit 800 or $J_E$ in circuit 900) in the SET signal path. A first positive SFQ pulse in the RESET signal is transmitted 1608 along the RESET signal path. This first positive SFQ pulse in the RESET signal does not lower the phase at the output node of the RZ-NRZ circuit to about 0 radians. A second positive SFQ pulse in the SET signal is transmitted 1610 along the SET signal path to de-trigger (trigger in a direction opposite the initial triggering) the escape JJ. This second positive SFQ pulse in the SET signal also does not lower the phase at the output node of the RZ-NRZ circuit to about 0 radians. A first negative SFQ pulse in the RESET signal is transmitted 1612 along the RESET signal path. This first negative SFQ pulse in the RESET signal also does not lower the phase at the output node of the RZ-NRZ circuit to about 0 radians. A second negative SFQ pulse in the SET signal is transmitted 1614 along the SET signal path and re-triggers (triggers in the direction of the initial triggering a second time) the escape JJ in the SET signal path. A second positive SFQ pulse in the RESET signal is transmitted 1616 along the RESET signal path. This second positive SFQ pulse in the RESET signal also does not lower the phase at the output node of the RZ-NRZ circuit to about 0 radians. A subsequent negative SFQ pulse in the RESET signal is transmitted 1618 along the RESET signal path to de-trigger the escape JJ, de-trigger the output JJ, and lower the phase at the output node to about 0 radians. The phase of this output node can be converted, for example, to a voltage signal of a desired high voltage level by an OA.

The RZ-NRZ circuitry described herein, as found in circuits 600, 800, and 900, is advantageously edge-triggered, rather than level-sensitive, and functions on state-based design principles, such that the functionality of the circuitry is substantially independent of system operating frequency. As compared to the example of FIG. 2 in which 0° and 180°-shifted data signals are, in effect, logically ORed to produce the output NRZ signal, the RZ-NRZ circuitry 600, 800, 900 of FIGS. 6, 8, and 9 do not evince phase boundary glitches, like those shown at 514, 516, 518, because in circuitry 600, 800, 900, no input SFQ signals trigger the output at the 0°/180° phase boundary points, given that interim pulses within an RZ pulse group are effectively discarded by one or more escape JJs. By contrast, with circuitry that logically ORs an input signal with a 180° shifted signal, the exactness of the relative timing of the input signal and the shifted input signal, among other factors, determines whether these two signals perfectly cancel each other out, or whether imperfect temporal alignment of the two signals manifests as phase boundary glitches. The RZ-NRZ circuitry described herein is thus substantially immune to glitches in NRZ outputs that might otherwise result from fabrication process and clock variations. For example, the RZ-NRZ circuitry described herein presents fewer potentials for error in the output signals of cryogenic computing systems when converting from SFQ-based RZ or NRZ signals for operation at about 4 kelvins to CMOS NRZ signals for operation at about 77 kelvins or about 300 kelvins (room temperature). The RZ-NRZ circuitry described herein thus provides improved bit error rates (BER), particularly for system clock rates around or in excess of 1 GHz. The RZ-NRZ circuitry is easily integrated with the current amplification stage of a DC-SQUID driver, such as driver 202 in FIG. 2. Circuits 800 and 900 are RQL compatible and require no constant DC bias currents.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. Superconducting circuitry for converting a single flux quantum (SFQ) based return-to-zero (RZ) reciprocal quantum logic (RQL) signal or non-return-to-zero (NRZ) RQL signal to an NRZ bilevel phase signal, the circuitry comprising:
   a SET signal input to a SET signal path configured to accept a first SFQ signal;
   a RESET signal input to a RESET signal path configured to accept a second SFQ signal based on the first SFQ signal;
   an output node at which the SET signal path and the RESET signal path are joined into an output path;
   an escape Josephson junction in the SET signal path between the SET signal input and the output node;
   an output Josephson junction coupled to the output node at a first end and to ground at a second end; and
   a primary output inductor in the output path, coupled to the output node at a first end and to ground at a second end.

2. The superconducting circuitry of claim 1, further comprising a Josephson transmission line (JTL) based phase shifter coupled between the SET signal input and the RESET signal input and configured to provide the second SFQ signal as a version of the first SFQ signal shifted by an amount of time such that a first negative SFQ pulse of the RESET signal, corresponding to and shifted in time from a first negative SFQ pulse of the SET signal that is immediately subsequent to a first positive SFQ pulse of the SET signal, is provided to the RESET signal path
   (a) after a second positive SFQ pulse of the SET signal, immediately subsequent to the first negative SFQ pulse of the SET signal, is provided to the SET signal path, and
   (b) before a second negative SFQ pulse of the SET signal, immediately subsequent to the second positive SFQ pulse of the SET signal, is provided to the SET signal path.

3. The superconducting circuitry of claim 2, wherein the JTL-based phase shifter is configured to provide the second SFQ signal as the version of the first SFQ signal shifted by between about 180° and about 225°.

4. The superconducting circuitry of claim 1, further comprising:
   an intermediate node in the RESET signal path between the RESET signal input and the output node; and
   an amplifying Josephson junction in the RESET signal path coupled between the intermediate node and ground.

5. The superconducting circuitry of claim 1, further comprising:
   an intermediate node in the RESET signal path between the RESET signal input and the output node; and
   a resistor in the RESET signal path coupled between the intermediate node and the output node.

6. The superconducting circuitry of claim 5, wherein the escape Josephson junction in the SET signal path is coupled at a first end to a first node in the SET signal path and at a second end to the output node, the superconducting circuitry further comprising:
   a first transformer-coupled secondary inductor coupled between the first node in the SET signal path and the output node; and
   a second transformer-coupled secondary inductor coupled between the intermediate node in the RESET signal path and ground,
   each of the first and second transformer-coupled secondary inductors being transformer-coupled to a respective primary inductor through which is provided a DC bias current.

7. The superconducting circuitry of claim 1, wherein the escape Josephson junction in the SET signal path is coupled at a first end to a first node in the SET signal path and at a second end to the output node, the superconducting circuitry further comprising:
   an intermediate node in the RESET signal path between the RESET signal input and the output node;
   a second node in the RESET signal path between the RESET signal input and the intermediate node; and
   an escape Josephson junction in the RESET signal path coupled at a first end to the second node in the RESET signal path and at a second end to the intermediate node.

8. The superconducting circuitry of claim 7, further comprising:
   a first transformer-coupled secondary inductor coupled between the first node in the SET signal path and the output node; and
   a second transformer-coupled secondary inductor coupled between the second node in the RESET signal path and the intermediate node,
   each of the first and second transformer-coupled secondary inductors being transformer-coupled to a respective primary inductor through which is provided a DC bias current.

9. The superconducting circuitry of claim 1, coupled to Josephson transmission line (JTL) based current amplification circuitry in a DC-SQUID driver, wherein the primary output inductor is configured to be transformer-coupled to a secondary inductor in at least one DC-SQUID loop in an output amplifier.

10. A method of converting a single flux quantum (SFQ) based return-to-zero (RZ) reciprocal quantum logic (RQL) signal to a bilevel non-return-to-zero (NRZ) quantum phase signal, the method comprising:
    providing an SFQ signal as a SET signal and a delayed version of the SFQ signal as a RESET signal to respective SET and RESET signal paths in an RZ-NRZ circuit;
    transmitting a positive SFQ pulse in the SET signal along the SET signal path to trigger an output JJ in the RZ-NRZ circuit and raise the phase at an output node of the RZ-NRZ circuit to about $2\pi$ radians;
    transmitting a negative SFQ pulse in the SET signal along the SET signal path to trigger an escape JJ in the SET signal path; and
    transmitting a positive SFQ pulse in the RESET signal along the RESET signal path, not lowering the phase at the output node to about 0 radians.

11. The method of claim 10, further comprising transmitting a negative SFQ pulse in the RESET signal along the RESET signal path to de-trigger the escape JJ, de-trigger the output JJ, and lower the phase at the output node to about 0 radians.

12. The method of claim 10, wherein the positive SFQ pulse in the SET signal is a first positive SFQ pulse in the SET signal, the negative SFQ pulse in the SET signal is a first negative SFQ pulse in the SET signal, and the positive SFQ pulse in the RESET signal is a first positive SFQ pulse in the RESET signal, the method further comprising:
- transmitting a second positive SFQ pulse in the SET signal along the SET signal path to de-trigger the escape JJ and not lower the phase at the output node to about 0 radians;
- transmitting a first negative SFQ pulse in the RESET signal along the RESET signal path, not lowering the phase at the output node to about 0 radians;
- transmitting a second negative SFQ pulse in the SET signal along the SET signal path to re-trigger the escape JJ;
- transmitting a second positive SFQ pulse in the RESET signal along the RESET signal path, not lowering the phase at the output node to about 0 radians; and
- transmitting a subsequent negative SFQ pulse in the RESET signal along the RESET signal path to de-trigger the escape JJ, de-trigger the output JJ, and lower the phase at the output node to about 0 radians.

13. The method of claim 10, wherein the positive SFQ pulse in the SET signal is a first positive SFQ pulse in the SET signal, the negative SFQ pulse in the SET signal is a first negative SFQ pulse in the SET signal, and the positive SFQ pulse in the RESET signal is a first positive SFQ pulse in the RESET signal, the method further comprising:
- transmitting a second positive SFQ pulse in the SET signal along the SET signal path to de-trigger the escape JJ and not lower the phase at the output node to about 0 radians; and
- transmitting a first negative SFQ pulse in the RESET signal along the RESET signal path to trigger a second escape JJ in the RESET signal path, not lowering the phase at the output node to about 0 radians.

14. The method of claim 10, wherein the RESET signal is provided as an output of a Josephson transmission line (JTL) based phase shifter to which the SFQ signal is provided as an input, the JTL-based phase shifter being configured to temporally shift the SFQ signal by an amount such that a first negative SFQ pulse in the RESET signal, corresponding to and shifted in time from the first negative SFQ pulse in the SET signal, which is immediately subsequent to the first positive SFQ pulse in the SET signal, is provided to the RESET signal path
  (a) after the second positive SFQ pulse in the SET signal, immediately subsequent to the first negative SFQ pulse in the SET signal, is provided to the SET signal path, and
  (b) before a second negative SFQ pulse in the SET signal, immediately subsequent to the second positive SFQ pulse in the SET signal, is provided to the SET signal path.

15. The method of claim 14, wherein the JTL-based phase shifter is configured to temporally shift the SFQ signal by between about 180° and about 225°.

16. DC-biased superconducting circuitry for converting an single flux quantum (SFQ) based return-to-zero (RZ) signal to a non-return-to-zero (NRZ) bilevel phase signal, the circuitry comprising:
- a SET signal path coupled between a SET signal input and a first node in a DC-SQUID loop, the SET signal path comprising:
  - a first SET-path Josephson junction coupled in series between the SET signal input and a first intermediate node, the first intermediate node being in the SET signal path between the SET signal input and the first node in the DC-SQUID loop; and
  - a second SET-path Josephson junction coupled between the first intermediate node and ground;
- a RESET signal path coupled between a RESET signal input and a second node in the DC-SQUID loop, the RESET signal path comprising:
  - a first RESET-path Josephson junction coupled in series between the RESET signal input and a second intermediate node, the second intermediate node being in the RESET signal path between the RESET signal input and the second node in the DC-SQUID loop; and
  - a second RESET-path Josephson junction coupled between the second intermediate node and ground;
- an output inductor coupled in the DC-SQUID loop coupled between the first node and the second node; and
- a DC voltage source coupled via a resistor to the first node in the DC-SQUID loop,
- wherein the DC-SQUID loop comprises a first DC-SQUID Josephson junction coupled between the first node in the DC-SQUID loop and ground, and a second DC-SQUID Josephson junction coupled between the second node in the DC-SQUID loop and ground.

17. The DC-biased superconducting circuitry of claim 16, further comprising:
- a SET-path input inductor coupled between the SET signal input and the first SET-path Josephson junction; and
- a RESET-path input inductor coupled between the RESET signal input and the first RESET-path Josephson junction.

18. The DC-biased superconducting circuitry of claim 17, further comprising:
- a second SET-path inductor coupled between the first intermediate node and the first node in the DC-SQUID loop; and
- a second RESET-path inductor coupled between the second intermediate node and the second node in the DC-SQUID loop.

19. The DC-biased superconducting circuitry of claim 18, further comprising:
- a first DC-SQUID loop inductor coupled in the DC-SQUID loop between the first node in the DC-SQUID loop and ground, in series with the first DC-SQUID Josephson junction; and
- a second DC-SQUID loop inductor coupled in the DC-SQUID loop between the second node in the DC-SQUID loop and ground, in series with the second DC-SQUID Josephson junction.

20. The DC-biased superconducting circuitry of claim 19, coupled to Josephson transmission line (JTL) based current amplification circuitry in a DC-SQUID driver, wherein the output inductor is configured to be transformer-coupled to a secondary inductor in at least one DC-SQUID loop in an output amplifier.

* * * * *